(12) United States Patent
Harrah

(10) Patent No.: US 6,936,855 B1
(45) Date of Patent: Aug. 30, 2005

(54) BENDABLE HIGH FLUX LED ARRAY

(76) Inventor: Shane Harrah, 1100 Sharon Park Dr., #27, Menlo Park, CA (US) 94025

( * ) Notice: Subject to any disclaimer, the term of this patent is extended or adjusted under 35 U.S.C. 154(b) by 255 days.

(21) Appl. No.: 10/337,552

(22) Filed: Jan. 7, 2003

Related U.S. Application Data

(60) Provisional application No. 60/348,500, filed on Jan. 16, 2002.

(51) Int. Cl.[7] .................. H01L 29/18; H01L 29/22; H01L 29/15; H01L 29/04; H01L 31/036; H01L 31/0376; H01L 31/20
(52) U.S. Cl. .................. 257/88; 257/99; 257/72; 257/59
(58) Field of Search .................. 257/99, 88, 72, 257/59, 81, 82, 93, 100

(56) References Cited

U.S. PATENT DOCUMENTS

| | | | |
|---|---|---|---|
| 4,040,078 A * | 8/1977 | Eckton et al. .............. 250/551 |
| 5,084,804 A | 1/1992 | Schairer |
| 5,404,282 A | 4/1995 | Klinke et al. |
| 5,519,596 A | 5/1996 | Woolverton |
| 5,821,688 A * | 10/1998 | Shanks et al. .............. 313/498 |
| 6,045,240 A * | 4/2000 | Hochstein .................. 362/294 |
| 6,133,589 A | 10/2000 | Krames et al. |
| 6,299,337 B1 | 10/2001 | Bachl et al. |
| 6,480,389 B1 * | 11/2002 | Shie et al. .................. 361/707 |
| 6,864,509 B2 * | 3/2005 | Worley ........................ 257/80 |
| 2001/0030866 A1 * | 10/2001 | Hochstein .................. 362/294 |
| 2002/0139981 A1 * | 10/2002 | Young ......................... 257/72 |
| 2003/0058650 A1 * | 3/2003 | Shih ............................. 362/294 |
| 2004/0065894 A1 * | 4/2004 | Hashimoto et al. ......... 257/100 |
| 2005/0024834 A1 * | 2/2005 | Newby ....................... 361/719 |

OTHER PUBLICATIONS

U.S. Appl. No. 09/974,563.
U.S. Appl. No. 09/469,657.

* cited by examiner

*Primary Examiner*—Nathan J. Flynn
*Assistant Examiner*—Victor A. Mandala, Jr.

(57) ABSTRACT

A bendable light emitting diode (LED) array in accordance with the present invention includes heat spreaders, dielectric material disposed above each heat spreader, and a bendable electrical interconnection layer disposed above these heat spreaders and electrically insulated from these heat spreaders by the dielectric material. At least one via passes through the dielectric material above each heat spreader, and at least one LED die is disposed above each via. The bendable electrical interconnection layer may be a lead frame comprising metal pathways that electrically interconnect some or all LED dice in series, in parallel, in anti-parallel, or in some combination of these configurations. Each via contains a thermally conductive material in thermal contact with the corresponding heat spreader below it and in thermal contact with the corresponding LED die above it. The LED dice may be thermally and electrically coupled to submounts disposed above corresponding heat spreaders in some embodiments.

49 Claims, 17 Drawing Sheets

BENDABLE HIGH FLUX LED ARRAY

This application claims the benefit of U.S. Provisional Application No. 60/348,500, filed on Jan. 16, 2002.

BACKGROUND INFORMATION

1. Field of the Invention

The present invention relates to light emitting diodes and more particularly to arrays of light emitting diodes.

2. Description of the Related Art

Arrays of light emitting diodes (LED) may be utilized in a variety of high flux applications such as street lighting, traffic signals, automobile turn signals and brake lights. One way to enhance the performance of such LED arrays is to increase the flux produced per unit area of the LED array. To increase the flux per unit area, the spacing between LEDs in the array can be decreased and/or the flux produced by each individual LED can be increased. However, either approach increases the amount of heat generated by the LEDs, which potentially can degrade the flux performance & long term reliability of the LEDs. Thus, what is needed is a high flux LED array that efficiently dissipates heat away from the LEDs, in order to prevent these problems.

In addition, some applications require high flux LED arrays which are bent into 3 dimensional (not coplanar) configurations. Such 3 dimensional configurations allow the LEDs' light to be simply directed in more different radiation patterns than coplanar LED arrays, without additional optics. Also such 3 dimensional configurations can fit inside housings with interior curvature not as suitable for coplanar LED arrays, such as some automobile housings for turn signals.

U.S. patent application Ser. No. 09/974,563 discloses a high flux LED array which can efficiently dissipate heat from each LED in the array. Heat flow from an LED die is maximized when heat can spread at a 45 degree angle away from the bottom surface of the LED die, in a pyramid-shaped heat flow pattern to a heat sink below. Typical LED lamps do not comprise special heat spreaders which allow this pyramid-shaped heat flow pattern away from the LED die. The heat flows away from a typical LED lamp through leads with relatively small cross sectional area (lead thickness X width) that prevents this pyramid-shaped heat flow pattern, thereby reducing the heat flow; The geometry of these leads confines the heat flow. U.S. patent application Ser. No. 09/974,563 discloses a high flux LED array without leads for each LED that reduce the heat flow. Each LED die in the array is either attached to a common metal substrate with a layer of thermally conductive material underneath, such as solder, or each LED die is mounted onto a larger, thermally conductive submount which is attached to the common metal substrate with a layer of thermally conductive material underneath. Either of these configurations allows heat to flow unimpeded in a pyramid-shaped heat flow pattern from the LED die into the common metal substrate, thus maximizing heat flow, unlike conventional arrays of typical LED lamps with leads. Although this prior patent application discloses an LED array which enhances heat dissipation, such an LED array does not have features particularly suitable for 3 dimensional configurations. If an LED array disclosed in this prior patent application is bent significantly into a 3 dimensional configuration, mechanical shear forces between the array's printed circuit board and the common metal substrate attached underneath may eventually lead to delamination between them, which is a potential long term reliability problem. This prior patent application does not disclose any features which enhance the bendability of the LED array, unlike the present invention, which comprises LED dice thermally coupled to spatially separated heat spreaders and electrically coupled to a bendable electrical interconnection layer.

U.S. Pat. No. 6,299,337 discloses an LED array with features that enhance bendability. This prior art invention comprises spatially separated rigid printed circuit boards and a flexible printed circuit board with LED lamps soldered onto the top surface, above all the rigid printed circuit boards. The flexible printed circuit board is attached to all the rigid printed circuit boards underneath it. This configuration allows the LED array to flex between the rigid printed circuit boards. Although this prior art patent discloses that each rigid printed circuit board may comprise a metal plate to spread heat away from the LED lamps, the flexible printed circuit board comprises a dielectric layer such as polyimide which is a thermal insulator. Because this dielectric layer is disposed between each LED lamp above and the metal plate underneath, without any via/opening that allows a thermally conductive material to thermally couple the LED with the metal plate below, heat transfer away from each LED to the metal plate is impeded. This disadvantage is avoided in the present invention, which comprises openings in the dielectric material that allow thermally conductive material(s) to thermally couple each LED die with a metal heat spreader underneath.

U.S. Pat. No. 5,084,804 also discloses an LED array with features that enhance bendability. This prior art LED array comprises LED dice attached to a bendable metal lead frame that electrically interconnects the LED dice. Each LED die, plus a portion of the lead frame, is encapsulated in a clear plastic housing. This prior art LED array may be bent in non-encapsulated portions of the metal lead frame, between the clear plastic housings. Although this configuration enhances bendability of the LED array, this configuration does not allow heat to flow unimpeded in a pyramid-shaped heat flow pattern from the bottom of each LED die to a heat sink below, so heat flow is not maximized. Instead heat must flow from each die through a metal lead frame, which has a significantly smaller cross sectional area (lead thickness X width) than the present invention's heat spreaders, to a heat sink. Both the shape and orientation of this prior art invention's components constrain the heat flow, preventing the optimal pyramid-shaped heat flow pattern from the bottom of each LED die to a heat sink below, unlike the LED die+heat spreader configurations in the present invention.

U.S. Pat. No. 5,404,282 and U.S. Pat. No. 5,519,596 both disclose LED arrays with features that enhance bendability. These prior art LED arrays each comprise a set of LED lamps electrically interconnected together with a bendable metal frame. The leads of each LED lamp in the array are structurally attached to a metal frame that includes bendable regions. Heat flows away from each LED die through the lamp's leads to the metal frame, which spreads the heat further. The geometry of these leads constrains the heat flow, preventing the optimal pyramid-shaped heat flow pattern from the bottom of each LED die to a heat sink below, unlike the LED die+heat spreader configurations in the present invention.

All these prior art LED arrays have inferior heat dissipation and/or inferior bendability when compared with the present invention.

SUMMARY OF THE INVENTION

A light emitting diode (LED) array in accordance with the present invention includes a plurality of metal heat spreaders, dielectric material disposed above each metal heat spreader, and a bendable electrical interconnection layer disposed above these metal heat spreaders and electrically insulated from these metal heat spreaders by the dielectric material. At least one via passes through the dielectric material above each metal heat spreader, and at least one LED die is disposed above each of the vias. The bendable electrical interconnection layer may be a thin metal lead frame comprising a plurality of metal pathways that electrically interconnect some or all LED dice in series, in parallel, in anti-parallel, or in some combination of these circuit configurations. Alternatively this bendable electrical interconnection layer may comprise electrically conductive metal traces on a flex circuit or on a bendable printed circuit board. These traces electrically interconnect the LED dice in a suitable circuit configuration. Each LED die in the array includes a first electrical contact and a second electrical contact electrically coupled to separate ones of these traces or the lead frame's metal pathways. Each of the vias contains a thermally conductive material in thermal contact with the corresponding metal heat spreader below it and in thermal contact with the corresponding LED die (dice) above it. The thermally conductive material may include, for example, a solder material or a thermally conductive adhesive.

In some embodiments, the dielectric material disposed above each metal heat spreader may simply be an electrically insulating adhesive, such as a layer of epoxy, which attaches each heat spreader to a common lead frame. In other embodiments, the dielectric material disposed above each metal heat spreader may be plastic injection molded onto portions of a common lead frame, in order to spatially separate each heat spreader from the lead frame. In alternative embodiments, the dielectric material may be a dielectric layer of a bendable printed circuit board or a dielectric layer of a flex circuit. Such a dielectric layer may be attached to the top of each heat spreader with a layer of adhesive.

In some embodiments, the thermally conductive material in a via is in direct physical contact with the corresponding metal heat spreader, in direct physical contact with the corresponding LED die (dice), or in direct physical contact with both the metal heat spreader and the LED die (dice). Such direct physical contact is sufficient but not necessary to establish thermal contact.

In some embodiments, a thermally conductive submount is disposed between one or more LED dice and the corresponding heat spreader. Every LED die in the array may be mounted onto submounts. Each submount may be in direct thermal contact with other thermally conductive material in the corresponding via. One or both of each LED die's electrical contacts may be electrically coupled to one or more electrical contacts on the corresponding submount. Use of such a submount allows incorporation of additional circuitry onboard and testing of the LED die (dice) prior to installation in the array.

In most embodiments, the LED die (dice) disposed above the corresponding heat spreader may be encapsulated in a lens. In some embodiments, the lens may simply comprise a clear plastic or elastomer which is cast or molded over each LED die. In other embodiments, the lens may be a clear hollow molded plastic piece disposed over the corresponding LED die (dice) and filled with a clear gel or elastomer that encapsulates the LED die (dice). Although such lenses improve the light extraction efficiency of the LED array and they may be useful for focusing the LEDs light, the LED array can function without such lenses.

Although many embodiments of the present LED array comprise metal heat spreaders which are spatially separated and not connected, some embodiments may comprise spatially separated metal heat spreaders which are structurally connected together with thinner bendable metal tie bars. In such embodiments, all the heat spreaders and tie bars in the array may be fabricated as one piece of metal, which simplifies assembly of the LED array.

In some embodiments, each metal heat spreader may be an integral part of a metal lead frame rather than a separate part disposed near the lead frame. Some portions of the metal lead frame may be pads that are thermally coupled to the LED dice. Portions of this lead frame may be thermal pathways that spread heat away from the LED dice.

Some embodiments comprise an inventive metal lead frame with some tie bars that are removed by a punching process after LED dice and metal heat spreaders are assembled into the present LED array. The electrical circuit configuration of such an LED array is determined by which lead frame tie bars are removed.

Each of the metal heat spreaders may be attached with a thermally conductive material to a metal base which functions as a heat sink. Because the electrical interconnection layer is bendable, the inventive LED array may be bent such that these heat spreaders can be attached to a curved surface on this base or to separate flat surfaces on this base that are not coplanar. Unlike conventional high power LED arrays, the present LED array comprises inventive features that readily allow it to be formed into a non-planar configuration of LEDs. Because the inventive LED array is bendable, the radiation pattern of the array is more readily variable than conventional flat arrays of LEDs.

BRIEF DESCRIPTION OF THE DRAWINGS

It should be noted that the parts shown in these figures are not necessarily to scale. Like reference numbers in the various figures denote like parts in the various embodiments.

DETAILED DESCRIPTION OF THE PREFERRED EMBODIMENT(S)

Figure 1:
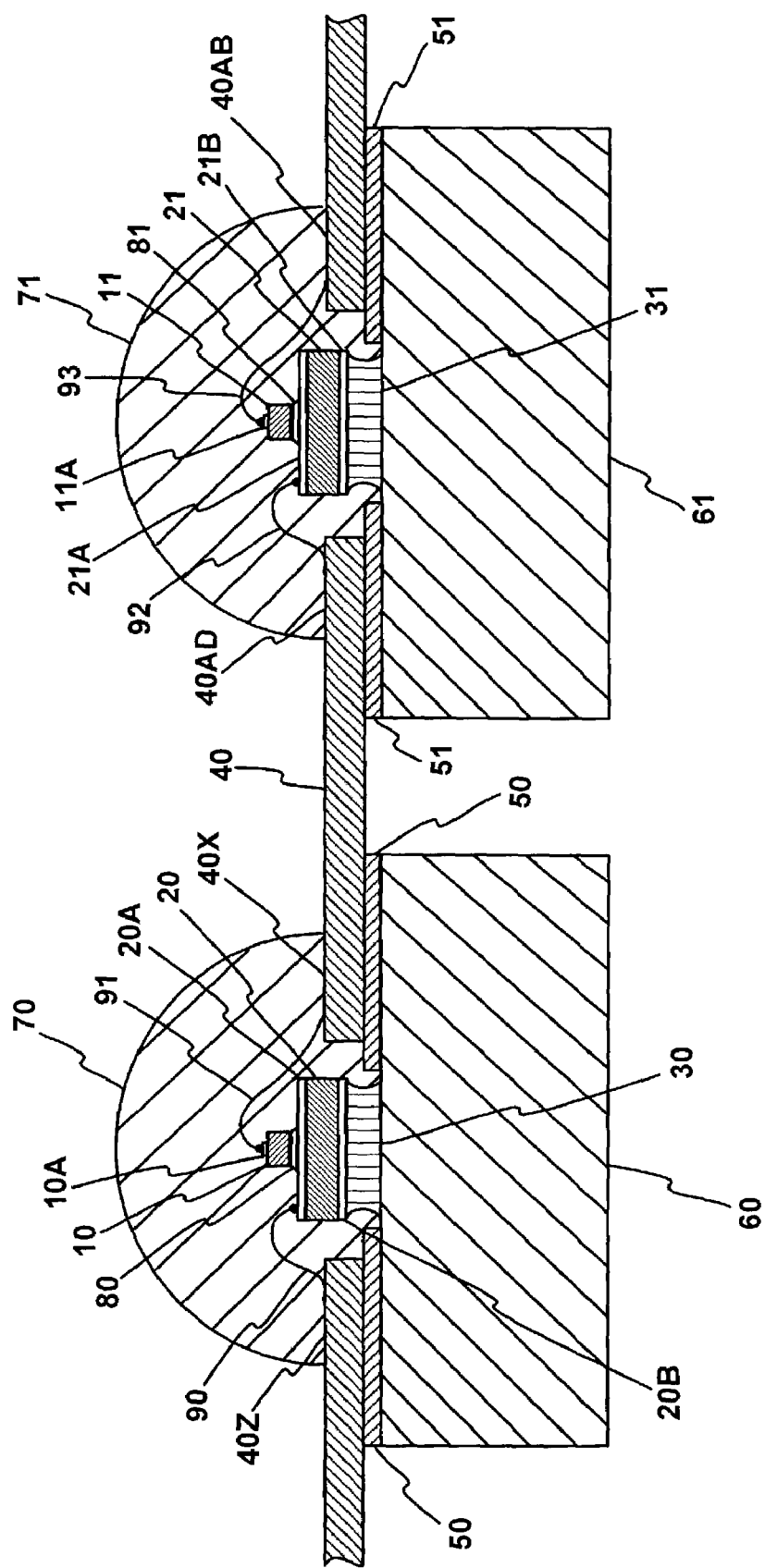
FIG. 1 schematically illustrates a portion of an LED array in accordance with a first embodiment of the present invention.

In a first embodiment of the present invention (FIG. 1), an LED (light emitting diode die) array comprises a plurality of LEDs (e.g., LED 10 and LED 11) and a plurality of metal heat spreaders (e.g., metal heat spreader 60 and metal heat spreader 61). Some dielectric material (e.g., dielectric layer 50 and dielectric layer 51), such as epoxy, is disposed over each metal heat spreader in this LED array. A bendable electrical interconnection layer is disposed over the dielectric material on each metal heat spreader, and this dielectric material electrically insulates this electrical interconnection layer from each metal heat spreader. As shown in FIG. 1, this electrical interconnection layer may be a metal lead frame 40 with a plurality of stamped or etched metal pathways which electrically interconnect all LEDs in series, in parallel, in anti-parallel, or in some combination of these circuit configurations. This lead frame's metal pathways are electrical current pathways which carry electricity to the LEDs when the array is suitably coupled to an electrical power supply. Each LED in this array may be a conventional LED with a top electrical contact pad (e.g., bond pad 10A and bond pad 11A) and a bottom electrical contact (e.g., bottom electrical contact layer 10B, bottom electrical contact layer 11B). A conventional bond wire (e.g., bond wire 91 and bond wire 93), typically 0.001"–0.002" diameter gold or aluminum, is bonded at one end to the LED top electrical contact and is bonded at the other end to a corresponding metal pathway (e.g., metal pathway 40X and metal pathway 40AB) of metal lead frame 40 which is adjacent to the LED's corresponding thermally conductive submount (e.g., LED submount 20 and LED submount 21). An electrically and thermally conductive die attach material (e.g., die attach layer 80 and die attach layer 81), such as conventional silver-filled epoxy or solder, is in direct electrical and thermal contact with the LED bottom electrical contact and with a corresponding top electrical contact (e.g., submount top electrical contact 20A and submount top electrical contact 21A) of a corresponding LED submount. This die attach material is disposed between each LED and the corresponding LED submount, and it structurally attaches each LED to the corresponding LED submount. As shown in FIG. 1, this thermally and electrically conductive material (e.g. die attach layer 80) is electrically coupled in series with the corresponding LED die (e.g. LED 10), corresponding bond wires (e.g. bond wire 90 and bond wire 91), and the top electrical contact of the corresponding LED submount (e.g. submount 20). Each LED submount may comprise a thin, thermally conductive substrate, possibly 0.005"–0.010" thick silicon or ceramic, with a metallized top surface, which is the submount top electrical contact, and a metallized bottom surface, which is the submount bottom thermal contact (e.g., submount bottom thermal contact 20B and submount bottom thermal contact 21B). A conventional bond wire (e.g., bond wire 90 and bond wire 92) is bonded at one end to a corresponding submount's top electrical contact and is bonded at the other end to a corresponding metal pathway (e.g., metal pathway 40Z and metal pathway 40AD) of lead frame 40 which is electrically insolated from a corresponding LED's top electrical contact and which is adjacent to the corresponding LED submount. Each LED's corresponding bond wires and die attach layer electrically couple the LED to two separate metal pathways of metal lead frame 40. The dielectric layer disposed over a corresponding metal heat spreader has a via (e.g., via 50A, via 51A, via 52A, and via 53A shown in FIG. 4) which contains a thermally conductive material (e.g., thermally conductive layer 30 and thermally conductive layer 31) with strong adhesion properties, such as silver-filled epoxy or solder (e.g., tin/lead solder). The thickness of this thermally conductive material is typically between 0.0005" and 0.005". The thermally conductive layer is in direct thermal contact with both the corresponding metal heat spreader and the corresponding submount bottom thermal contact. This thermally conductive layer is disposed between the corresponding LED submount and the corresponding metal heat spreader, and this layer structurally attaches these parts.

Figure 8:
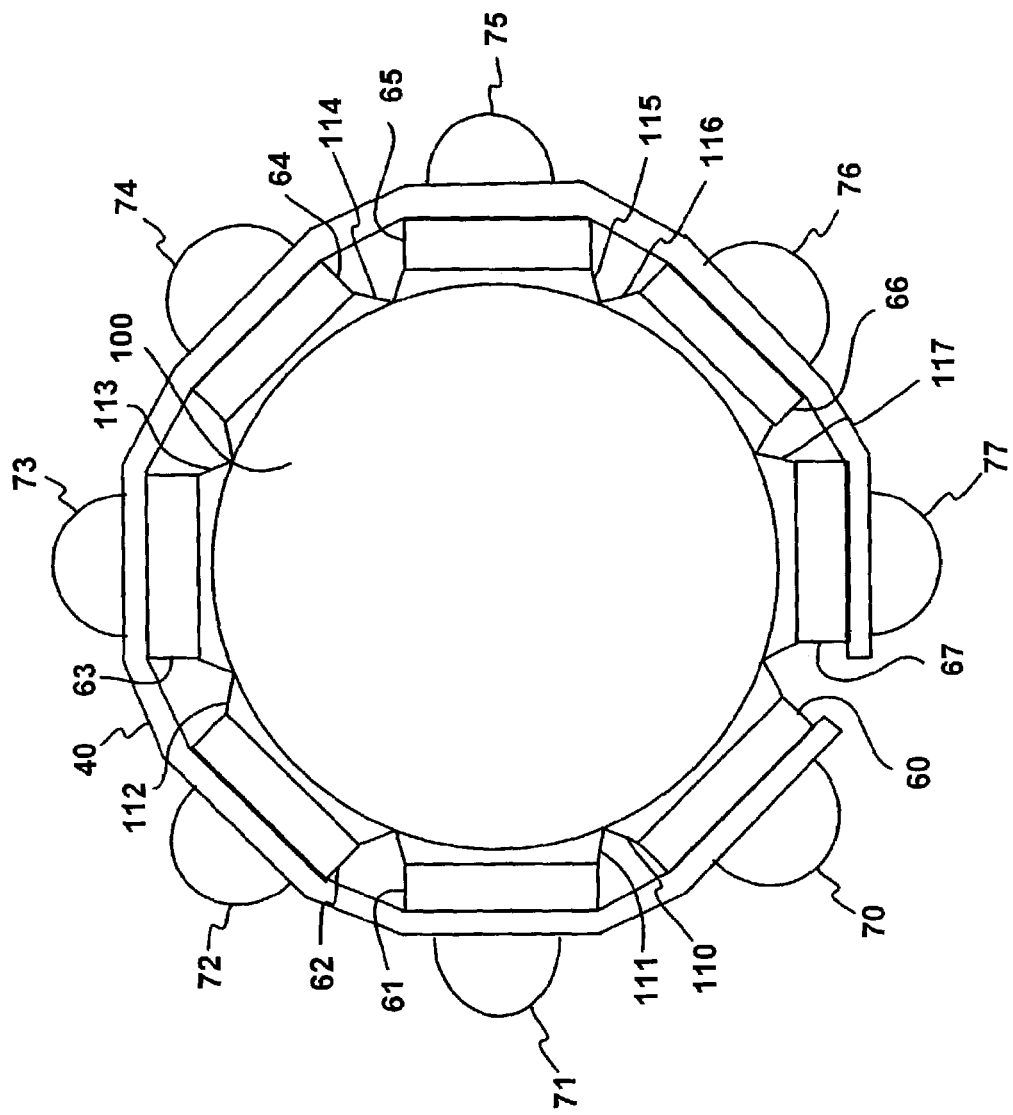
FIG. 8 illustrates a first embodiment, a second embodiment, a third embodiment, a fifth embodiment, a sixth embodiment, or a seventh embodiment of the present invention attached around a cylindrical metal base.

Together the corresponding die attach layer, the corresponding LED submount, and the corresponding thermally conductive layer for the submount form a thermal conduction means for heat to flow from the LED to the corresponding metal heat spreader. As illustrated in FIG. 8, each metal heat spreader (e.g., heat spreader 60, heat spreader 61, heat spreader 62, heat spreader 63, heat spreader 64, heat spreader 65, heat spreader 66, heat spreader 67) in the present LED array may be structurally attached with thermally conductive material (e.g., thermally conductive layer 110, thermally conductive layer 111, thermally conductive layer 112, thermally conductive layer 113, thermally conductive layer 114, thermally conductive layer 115, thermally conductive layer 116, and thermally conductive layer 117) such as silver-filled epoxy or solder to a metal base (e.g., cylindrical metal base 100) which functions as a heat sink. In the embodiments shown in FIG. 1, FIG. 2, FIG. 3, FIG. 6, FIG. 9, FIG. 10, FIG. 11, and FIG. 18, the bottom of each metal heat spreader is an effective heat transfer surface when attached to a suitable heat sink. In such configurations, some heat generated by each LED is effectively dissipated by the metal base, which keeps the operating temperature of each LED lower. When the temperature of an LED is lower, the LED efficiency is higher, so the LED produces more flux at a given current. When the present LED array comprises high flux LEDs and all the metal heat spreaders are thermally coupled to a common heat sink, the present LED array may operate at a relatively high current (>70 mA through each LED, depending on the LED size, the efficiency of the heat sink, and the ambient temperature) to produce higher flux than most previous LED arrays.

Each LED and corresponding LED submount is encapsulated in a corresponding housing (e.g., lens 70 and lens 71), along with the corresponding bond wires. Such encapsulation allows more light to escape from each LED due to better match between the index of refraction of each LED and the medium surrounding it. This housing may simply comprise a clear plastic, clear elastomer (such as silicone), or other optically transmissive material that is cast or molded over the corresponding LED and corresponding LED submount. The corresponding metal heat spreader, corresponding dielectric layer, and metal lead frame 40 include a set of through holes (examples shown in FIG. 4: hole 40BJ, hole 40BK, hole 40BL, hole 40BM; hole 40BN, hole 40BP, hole 40BQ, hole 40BR; hole 40BS, hole 40BT, hole 40BU, hole 40BV; hole 40BW, hole 40BX, hole 40BY, hole 40BZ) for plastic or elastomer flow during casting or molding of this housing onto the present LED array. The plastic or elastomer remains in these holes afterwards as cylindrical pegs that help lock each housing to lead frame 40 and to the corresponding metal heat spreader.

Figure 16:
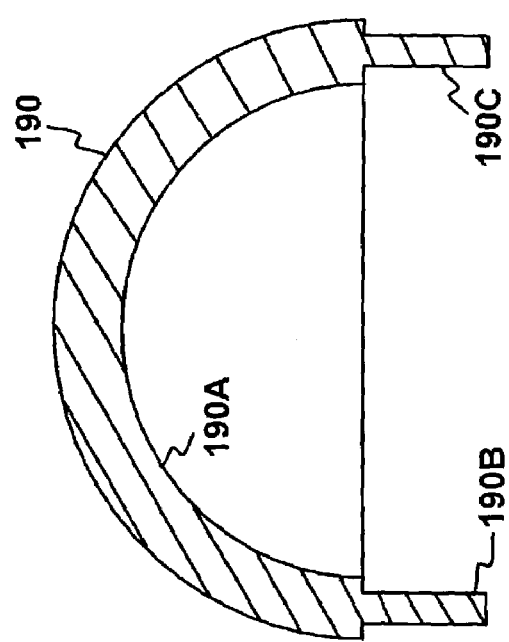
FIG. 16 illustrates in cross section view a hollow lens, which may be disposed over each LED in alternate embodiments of the LED array.

Although the embodiments shown in FIG. 1, FIG. 2, FIG. 3, FIG. 6, FIG. 9, FIG. 10, FIG. 11, and FIG. 14 comprise housings which are cast or molded over the corresponding LEDs, each housing alternatively may be a clear molded plastic piece (e.g., lens 190, FIG. 16) with a hollow interior (e.g., hollow lens interior 190A) disposed over the corresponding LED(s) and filled with a clear gel or clear elastomer (such as silicone) or other optically transmissive material that encapsulates the corresponding LED(s). The index of refraction of this clear gel or elastomer may be similar to the index of refraction of the lens material. Each such hollow lens may comprise several cylindrical pegs (e.g., lens peg 190B, lens peg 190C) disposed underneath which may be press fit or heat staked into several holes (e.g., hole 40BJ and hole 40BL shown in FIG. 4) which pass through the corresponding metal heat spreader (e.g., heat spreader 60), the corresponding dielectric layer (e.g., dielectric layer 50), and the bendable electrical interconnection layer (e.g., lead frame 40). Such press fit or heat staked pegs may secure each hollow lens to the corresponding heat spreader and to the bendable electrical interconnection layer. Alternatively each hollow lens may be attached to the LED array with other conventional means, such as a layer of adhesive underneath the lens. Clear gel or elastomer may be injected from below into the hollow interior of each lens through a hole (e.g., hole 40BM shown in FIG. 4) in the corresponding heat spreader (e.g., heat spreader 60), in the corresponding dielectric layer (e.g., dielectric layer 50), and in the bendable electrical interconnection layer (e.g., lead frame 40). There may be an additional hole (e.g., hole 40BK shown in FIG. 4) through the corresponding heat spreader (e.g., heat spreader 60), the corresponding dielectric layer (e.g., dielectric layer 50), and the bendable electrical interconnection layer (e.g., lead frame 40) for overflow of excess gel or elastomer in each hollow lens. Although such lenses improve the light extraction efficiency of the LED array and they may be useful for focusing the LEDs light, the LED array can function without any lenses.

Lead frame 40 may comprise material, such as 0.005"–0.015" thick copper alloy sheet, used in conventional lead frames for integrated circuit packages or LED lamps. In embodiments of the present invention which comprise bond wires, this lead frame material is plated with bondable metal layers, such as a gold layer over a nickel layer, suitable for attaching bond wires. These bondable metal layers may be selectively plated in lead frame areas where bond wires are attached (e.g., metal pathway 40Z, metal pathway 40X, metal pathway 40AD, and metal pathway 40AB), or these bondable metal layers may be plated everywhere on the lead frame. In embodiments of the present invention which comprise LEDs or LED submounts that are soldered onto lead frame 40 (FIG. 9, FIG. 11, FIG. 14), lead frame 40 may be selectively plated with a solderable metal layer, such as a tin/lead alloy, in lead frame areas where LEDs or LED submounts are soldered (e.g., metal pathway 40Z, metal pathway 40X, metal pathway 40AD, and metal pathway 40AB).

Figure 4:
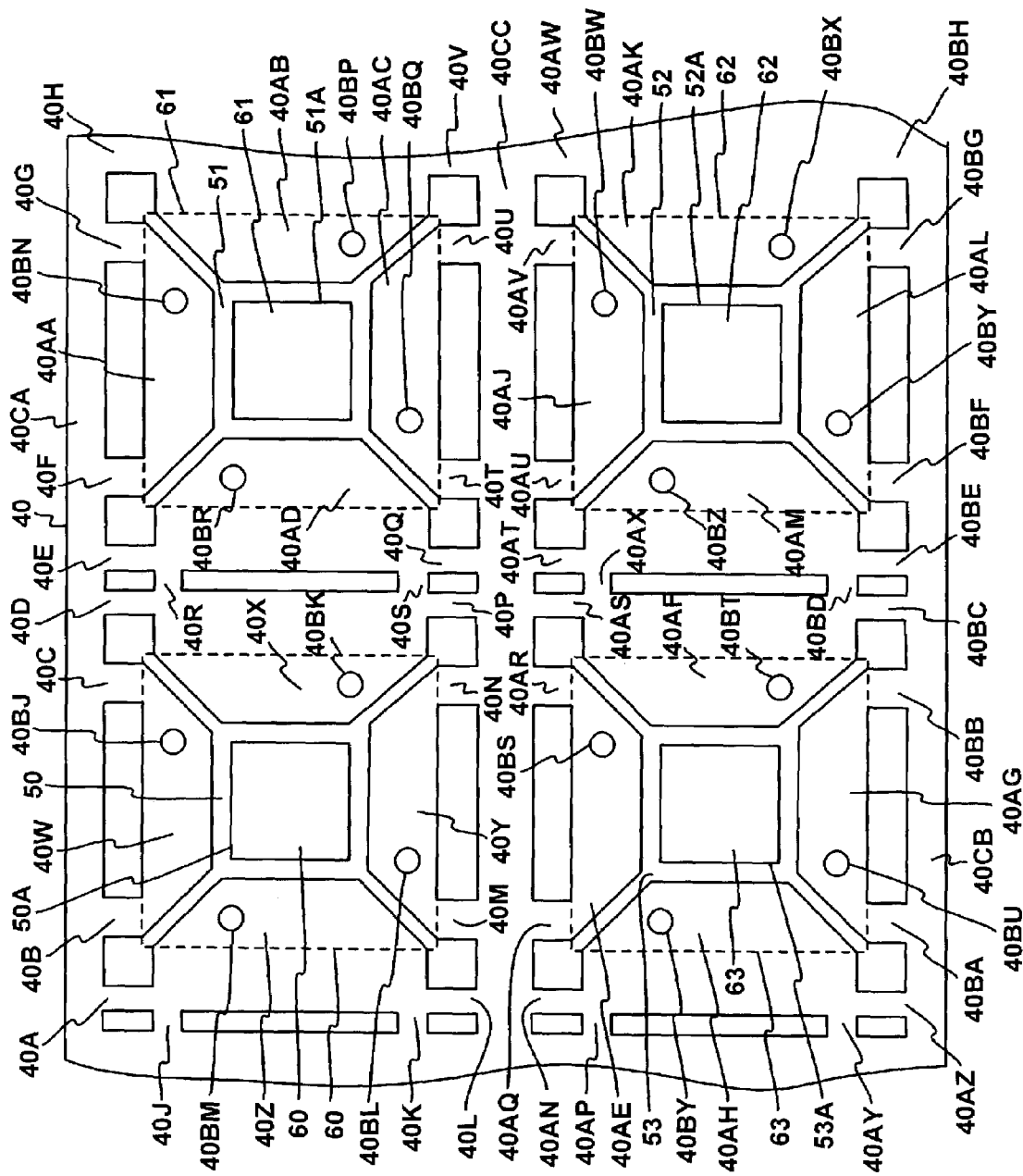
FIG. 4 illustrates in a top view a portion of a metal lead frame, with heat spreaders underneath, in accordance with embodiments of the present invention shown in FIG. 1, FIG. 2, FIG. 3, FIG. 8, FIG. 9, FIG. 10, and FIG. 11.

Prior to plating, an etching or stamping process creates metal pathways and metal tie bars in lead frame 40 (FIG. 4). After plating, lead frame 40 may be attached above the metal heat spreaders (e.g., heat spreader 60, heat spreader 61, heat spreader 62, heat spreader 63) with dielectric adhesive (e.g., dielectric layer 50, dielectric layer 51, dielectric layer 52, dielectric layer 53). Subsequently some lead frame tie bars may be removed, for example by punching, in order to electrically isolate some metal pathways from other metal pathways in lead frame 40. This tie bar removal process may occur either prior to further assembly of the present LED array or may occur after the LEDs and lenses have been assembled onto the present LED array. If a first set of tie bars (e.g., tie bar 40A, tie bar 40D, tie bar 40E, tie bar 40H, tie bar 40L, tie bar 40P, tie bar 40Q, tie bar 40V, tie bar 40AN, tie bar 40AS, tie bar 40AT, tie bar 40AW, tie bar 40AZ, tie bar 40BC, tie bar 40BE, tie bar 40BH) is removed from lead frame 40, then the LEDs electrically coupled to a first set of metal pathways (e.g., metal pathway 40Z, metal pathway 40X, metal pathway 40AD, metal pathway 40AB) are connected in series, and independently the LEDs electrically coupled to a second set of metal pathways (e.g., metal pathway 40AH, metal pathway 40AF, metal pathway 40AM, metal pathway 40AK) are connected in series. With the first set of tie bars removed, if a first electrical contact of each LED in the present array is electrically coupled to a third set of metal pathways (e.g., metal pathway 40Y, metal pathway 40AE, metal pathway 40AC, metal pathway 40AJ) which are electrically coupled together, and if a second electrical contact of each LED in the present array is electrically coupled to a fourth set of metal pathways (e.g., metal pathway 40W, metal pathway 40AA, metal pathway 40AG, metal pathway 40AL) which are electrically coupled together, then the all LEDs in the present array are connected in parallel. Depending on which tie bars of lead frame 40 are removed, and depending on which metal pathways each LED is electrically coupled with, other LED array electrical configurations are also possible. If the first set of tie bars is removed, a second set of tie bars (e.g., tie bar 40B, tie bar 40C, tie bar 40F, tie bar 40G, tie bar 40M, tie bar 40N, tie bar 40T, tie bar 40U, tie bar 40AQ, tie bar 40AR, tie bar 40AU, tie bar 40AV, tie bar 40BA, tie bar 40BB, tie bar 40BF, tie bar 40BG) and a fifth set of metal pathways (e.g., metal pathway 40CA, metal pathway 40CC, and metal pathway 40CB) structurally couple lead frame 40 together. Some tie bars electrically and structurally couple adjacent metal pathways together. For example, in the first LED array electrical configuration described previously, a third set of tie bars (e.g., tie bar 40J, tie bar 40K, tie bar 40R, tie bar 40S, tie bar 40AP, tie bar 40AY, tie bar 40AX, tie bar 40BD) electrically and structurally couples adjacent metal pathways together. Similarly, in the second LED array electrical configuration described previously, the second set of tie bars electrically as well as structurally couples adjacent metal pathways together.

Metal pathways which are structurally connected together with tie bars are bendable electrical current pathways. As shown in FIG. 4, each such bendable electrical current pathway comprises several narrow portions (e.g., tie bar 40R and tie bar 40S) for enhanced bendability therein and several wide portions (e.g., metal pathway 40X and metal pathway 40AD) for enhanced structural stiffness therein. Although the lead frames shown in FIG. 4 and FIG. 15 comprise electrical current pathways with narrow portions for enhanced bendability and wide portions for enhanced structure stiffness, other suitable lead frames may comprise alternative electrical current pathway configurations, provided that at least some electrical current pathways comprise bendable portions. Bendable portions of the electrical current pathways (e.g., tie bar 40R and tie bar 40S) are disposed between adjacent housings for the LED dice (e.g., lens 70 and lens 71) in most embodiments of the present invention.

Because lead frame 40 can be bent easily at the tie bar locations, the present LED array may be readily bent such that the bottom of each heat spreader in the array can be attached to a curved surface on a common base (e.g., metal base 100, as shown in FIG. 8) or to separate flat surfaces on a common base which are not coplanar. Unlike conventional high flux LED arrays, the present LED array comprises inventive features that readily allow it to be formed into a non-planar configuration of LEDs. Because the inventive LED array is bendable, each LED lens (e.g., lens 70, lens 71, lens 72, lens 73, lens 74, lens 75, lens 76, lens 77) in the array can be aimed in a different direction. Thus the radiation pattern of the present LED array is more readily variable than conventional flat, rigid LED arrays, which is a key advantage over prior art high flux LED arrays.

Figure 17:
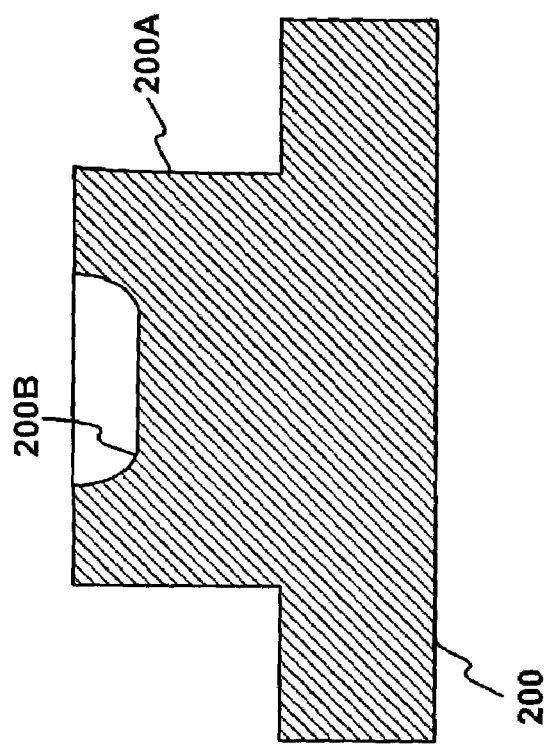
FIG. 17 illustrates in cross section view an alternate metal heat spreader, which includes an LED reflector cup.

As shown in FIG. 4, embodiments comprising a metal lead frame attached above dielectric layers attached to underlying metal heat spreaders may have an opening in the lead frame and dielectric layer above each heat spreader. A first portion of this opening is created by a via (e.g., via 50A) through the corresponding dielectric layer (e.g., dielectric layer 50) attached to a first portion of the corresponding heat spreader's (e.g., heat spreader 60) top surface. A second portion of this opening is created by the gap between adjacent metal pathways (e.g., metal pathway 40W, metal pathway 40X, metal pathway 40 Y, metal pathway 40Z) of the electrical interconnection layer (e.g., lead frame 40). These adjacent metal pathways are attached above a first portion of the corresponding dielectric layer (dielectric layer 50). There is at least one such opening disposed over each metal heat spreader. One or more thermally conductive materials (e.g., thermally conductive layer 30, submount 20, and die attach layer 80) are disposed above a second portion of the corresponding heat spreader's (e.g., heat spreader 60) top surface and are disposed underneath the corresponding LED die (e.g., LED 10), as shown in FIG. 1. One of these thermally conductive materials (e.g., thermally conductive layer 30) is thermally coupled directly to this second portion of the corresponding heat spreader's top surface, and one of these thermally conductive materials (e.g., die attach layer 80) is thermally coupled directly to the bottom surface of the corresponding LED die. In the embodiments shown in FIG. 1, FIG. 2, FIG. 3, FIG. 6, FIG. 9, FIG. 10, and FIG. 11, the second portion of each heat spreader's top surface is directly underneath the corresponding opening in the dielectric layer and metal lead frame. In other embodiments, an upper portion (e.g. heat spreader cylinder 200A of heat spreader 200, shown in FIG. 17) of each heat spreader is disposed through the corresponding opening in the dielectric layer and metal lead frame, whereby the second portion of each heat spreader's top surface (e.g., surface of the heat spreader's reflector cavity 200B, shown in FIG. 17) may be disposed above the electrical interconnection layer, and the first portion of each heat spreader's top surface (e.g., top surface of the heat spreader base 200C, shown in FIG. 17) may be disposed below the electrical interconnection layer and corresponding dielectric layer.

In a second embodiment of the present invention (FIG. 2), an LED array comprises a plurality of LEDs (e.g., LED 15 and LED16) which each have a first electrical contact and a second electrical contact both disposed on a top side. A bond wire (e.g., bond wire 90 and bond wire 92) is attached at one end to a corresponding LED's first electrical contact (e.g., LED electrical contact 15B and LED electrical contact 16B) and is attached at the other end to a corresponding metal pathway (e.g., metal pathway 40Z and metal pathway 40AD) of lead frame 40 which is adjacent to the corresponding LED. Another bond wire (e.g., bond wire 91 and bond wire 93) is attached at one end to the corresponding LED's second electrical contact (e.g., LED electrical contact 15A and LED electrical contact 16A) and is attached at the other end to another corresponding metal pathway (e.g., metal pathway 40X and metal pathway 40AB) of lead frame 40 which is adjacent to the corresponding LED. These bond wires electrically couple the corresponding LED to separate metal pathways of lead frame 40. In this second embodiment, a thermally conductive material (e.g., thermally conductive layer 30 and thermally conductive layer 31) is in direct thermal contact with a bottom side of a corresponding LED and is in direct thermal contact with a corresponding metal heat spreader (e.g., heat spreader 60 and heat spreader 61). The bottom side of each LED is a thermal contact (e.g., LED thermal contact 15C, LED thermal contact 16C), which may comprise a deposited metal layer, a deposited dielectric layer, or may be an exposed surface of semiconductor material. If the bottom side of an LED is not electrically isolated from the LED's P-type and N-type regions, then the corresponding thermally conductive layer (e.g., thermally conductive layer 30) may comprise a dielectric material (e.g., die attach epoxy with a thermally conductive dielectric filler), if necessary, to electrically isolate the LED from a corresponding metal heat spreader. Alternatively the corresponding metal heat spreader may have a dielectric layer disposed between it and a common metal base (e.g., metal base 100), if necessary, to electrically isolate each LED in the present LED array from the common metal base. This dielectric layer may be anodization on the surface of an aluminum heat spreader, for example. Alternatively this dielectric layer may be a thermally conductive dielectric adhesive (e.g., thermally conductive layer 110, thermally conductive layer 111, thermally conductive layer 112, thermally conductive layer 113, thermally conductive layer 114, thermally conductive layer 115, thermally conductive layer 116, and thermally conductive layer 117), such as epoxy with a thermally conductive dielectric filler, which structurally attaches the corresponding heat spreader to the common metal base. Except as already noted, this second embodiment of the present LED array comprises the same components as the first embodiment, disposed in a similar configuration.

In a third embodiment of the present invention (FIG. 3), the LED array comprises the same components as the first embodiment, with the exception that there is no LED submount. Instead each electrically and thermally conductive die attach layer (e.g., die attach layer 80 and die attach layer 81) is in direct thermal contact with a corresponding metal heat spreader (e.g., heat spreader 60 and heat spreader 61) and in direct thermal contact with a bottom electrical contact of a corresponding LED (e.g., LED 10 and LED 11). Each die attach layer electrically and structurally couples the corresponding LED and the corresponding metal heat spreader, and each die attach layer is disposed between the corresponding LED and the corresponding metal heat spreader. A bond wire (e.g., bond wire 90 and bond wire 92) is attached at one end to a topside of a corresponding metal heat spreader, within a via (e.g., via 50A and via 51A) in the corresponding dielectric layer (e.g., dielectric layer 50 and dielectric layer 51). This bond wire is attached at the other end to a corresponding metal pathway (e.g., metal pathway 40Z and metal pathway 40AD) of lead frame 40 which is adjacent to the corresponding LED, thereby electrically coupling the bottom electrical contact of the corresponding LED with this corresponding metal pathway. Each metal heat spreader may have a corresponding thermally conductive dielectric layer (e.g., thermally conductive layer 110, thermally conductive layer 111, thermally conductive layer 112, thermally conductive layer 113, thermally conductive layer 114, thermally conductive layer 115, thermally conductive layer 116, and thermally conductive layer 117) disposed between it and a common metal base (e.g., metal base 100), if necessary, to electrically isolate each LED in the present LED array from the common metal base. This dielectric layer may be a thermally conductive dielectric adhesive, such as epoxy with a thermally conductive dielectric filler, which structurally attaches the corresponding heat spreader to the common metal base. Except as already noted, this third embodiment of the present LED array comprises components disposed in the same configuration as in the first embodiment.

Figure 6:
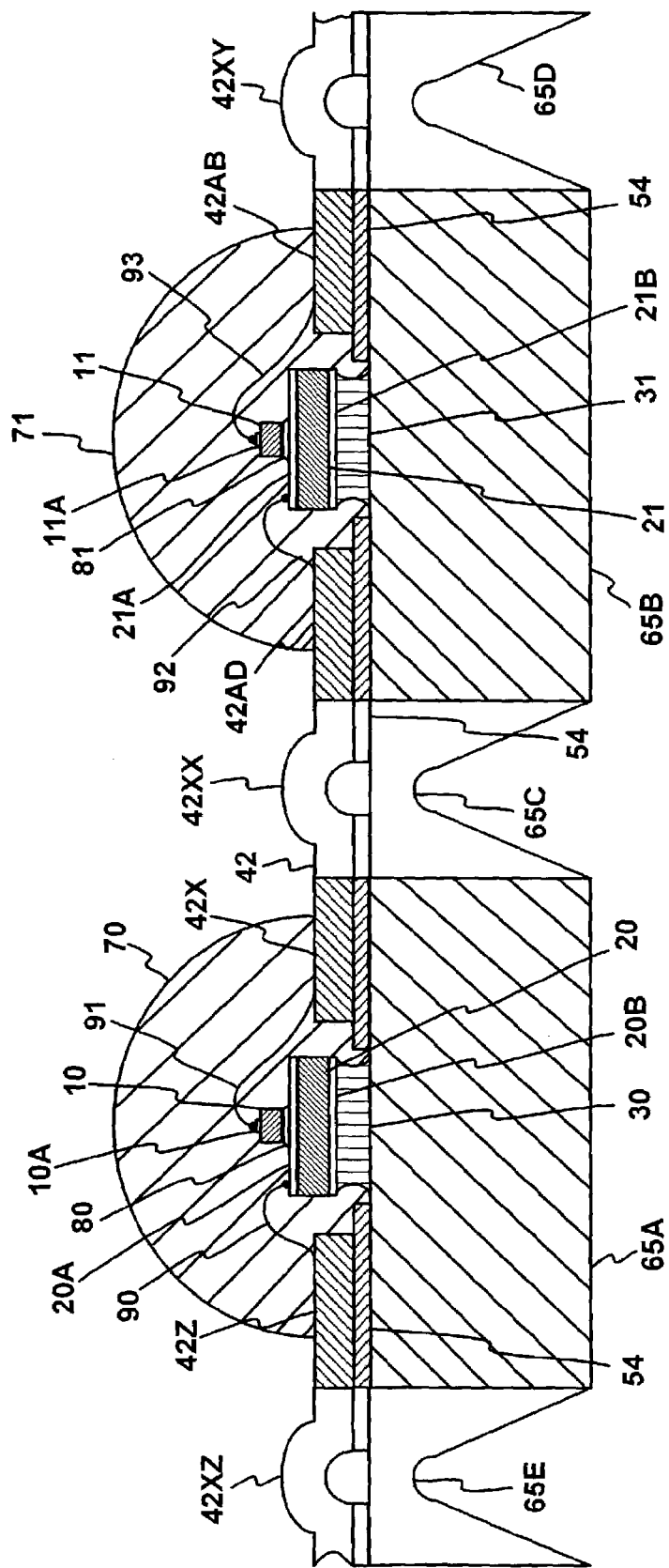
FIG. 6 schematically illustrates a portion of an LED array in accordance with a fourth embodiment of the present invention.
Figure 7:
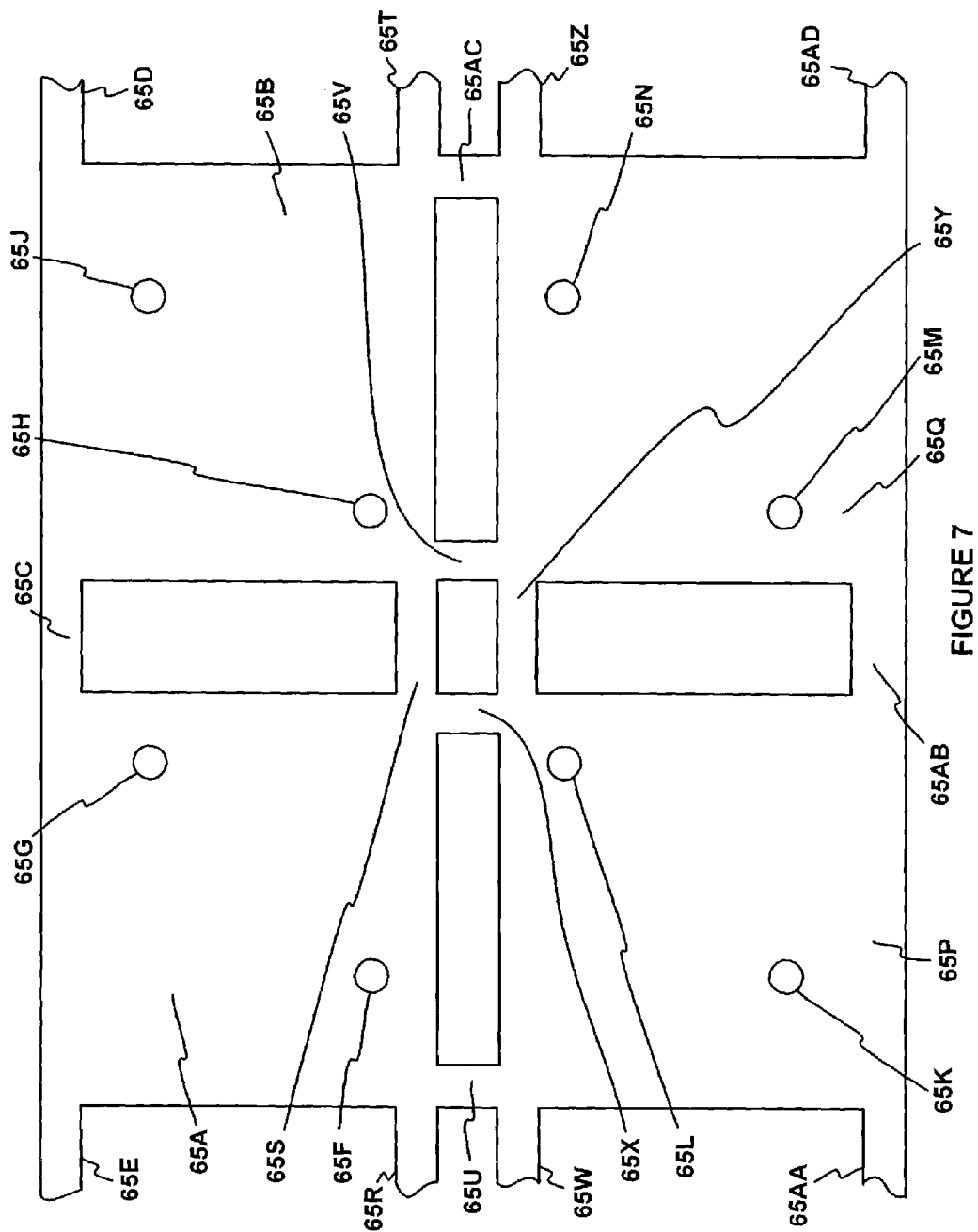
FIG. 7 illustrates a top side of some metal heat spreaders connected together with tie bars in accordance with a fourth embodiment of the present invention.

In a fourth embodiment of the present invention (FIG. 6), the LED array comprises components disposed in the same configuration as in the first embodiment. The components in this fourth embodiment are similar to the components in the first embodiment, with the exception of the bendable electrical interconnection layer (e.g., metal lead frame 42) and the metal heat spreaders (e.g., heat spreader 65A, heat spreader 65B, heat spreader 65Q, heat spreader 65P, shown in FIG. 7). Unlike lead frame 40, some or all the tie bars (e.g., tie bar 42XZ, tie bar 42XX, tie bar 42XY) in lead frame 42 are pre-bent for stress relief. As shown in FIG. 6, each lead frame tie bar may be bent into a C shape, although each lead frame tie bar may be pre-bent into another shape for stress relief instead, such as a V shape or an S shape. These stress relief features are formed in lead frame 42 prior to attachment of lead frame 42 into the LED array. Such lead frame stress relief features reduce shear stress between the metal pathways (e.g., metal pathway 42Z, metal pathway 42X, metal pathway 42AD, and metal pathway 42AB) of lead frame 42, the dielectric adhesive layer 54 underneath, and the metal heat spreaders when the finished LED array is subsequently bent into a non-planar configuration, such as the LED array configuration shown in FIG. 8. By reducing this shear stress, the probability that any metal pathway will separate from the dielectric adhesive layer is reduced, so these lead frame stress relief features enhance the structural integrity of this fourth embodiment. With the exception of these stress relief features in the tie bars, lead frame 42 may comprise the same features as lead frame 40. The metal heat spreaders in this fourth embodiment are structurally coupled to each other with bendable metal interconnection members (e.g., tie bar 65E, tie bar 65C, tie bar 65D, tie bar 65R, tie bar 65S, tie bar 65T, tie bar 65U, tie bar 65X, tie bar 65V, tie bar 65W, tie bar 65Y, tie bar 65Z, tie bar 65AA, tie bar 65AB, tie bar 65AD, tie bar 65AC, shown in FIG. 7) disposed between them. Together these heat spreaders and bendable interconnection members may be fabricated as one piece (e.g., heat spreader array 65) of thermally conductive metal, such as copper that is plated after fabrication to prevent tarnish, which is a bendable thermally conductive metal substrate. This fabrication process may be casting, stamping, or some other conventional metal fabrication method. Because each metal tie bar is narrow (as shown in FIG. 7) and is thinner (e.g., 0.005"–0.010" thick) than the metal heat spreaders (as shown in FIG. 6), the heat spreader array 65 may be readily bent at the tie bar locations. These tie bars of heat spreader array 65 may be disposed adjacent to the tie bars of leadframe 42. Each metal heat spreader in heat spreader array 65 comprises a set of through holes (e.g., hole 65F and hole 65G; hole 65H and hole 65J; hole 65K and hole 65L; hole 65M and hole 65N) for plastic or elastomer flow during molding or casting a lens (e.g., lens 70, lens 71) over the corresponding LED, similar to the first embodiment. Because heat spreader array 65 is one piece, this fourth embodiment of the present LED array may be simpler to assemble than other embodiments that comprise unconnected heat spreaders that must be handled separately during assembly.

Other embodiments of a heat spreader array are also possible. A second embodiment of a heat spreader array may comprise metal heat spreaders, which are thin (e.g., <0.020" thickness) and may comprise tie bars that are the same thickness as the metal heat spreaders, unlike heat spreader array 65. A top side and a bottom side of this second embodiment of a heat spreader array both may appear similar to a top side of heat spreader array 65 (FIG. 7). A third embodiment of a heat spreader array may comprise thin (e.g., 0.005"–0.010" thickness) bendable regions disposed between thicker metal heat spreaders. Unlike heat spreader array 65, this third embodiment of a heat spreader does not comprise narrow individual tie bars. A top side of this third embodiment of a heat spreader array does not comprise openings between adjacent heat spreaders, unlike heat spreader array 65. The second embodiment and the third embodiment of a heat spreader array may be somewhat less expensive to fabricate than heat spreader array 65, although each embodiment is fabricated as one metal piece.

Figure 12:
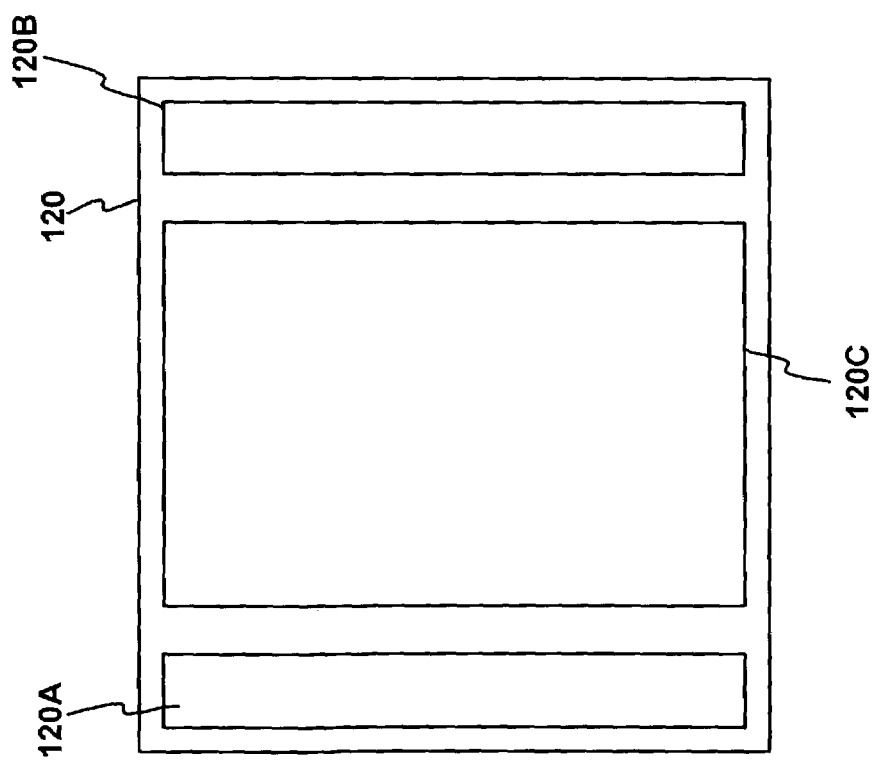
FIG. 12 illustrates a bottom side of an LED in accordance with a fifth embodiment of the present invention.

In a fifth embodiment of the present invention (FIG. 9), an LED array comprises the same components as in the second embodiment, with the exception that each LED is a flip chip (e.g., flip chip LED 120 and flip chip LED 121) electrically coupled to metal pathways (e.g., metal pathway 40Z, metal pathway 40X, metal pathway 40AD, metal pathway 40AB) of lead frame 40 with re-flowed solder (e.g., solder layer 130, solder layer 131, solder layer 132, solder layer 133) instead of with wire bonds. This re-flowed solder may be a tin/lead alloy or some other solder with good electrical conductivity and with good adhesion to the metal pathway plating and to a first electrical contact (e.g., LED electrical contact 120A, LED electrical contact 121A) and a second electrical contact (e.g., LED electrical contact 120B, LED electrical contact 121B) on a bottom side of each flip chip LED (FIG. 12). Alternatively an electrically conductive adhesive, such as silver-filled epoxy, may be used instead of solder to electrically couple the first electrical contact and the second electrical contact to corresponding metal pathways. The bottom side of each flip chip LED also comprises a thermal contact (e.g., LED thermal contact 120G, LED thermal contact 121G) which is in direct thermal contact with thermally conductive material (e.g., thermally conductive layer 30, thermally conductive layer 31). Each thermally conductive layer is also in direct thermal contact with a corresponding metal heat spreader (e.g., metal heat spreader 60, metal heat spreader 61). Each thermally conductive layer structurally and thermally couples a flip chip LED with a corresponding metal heat spreader. The first electrical contact, the second electrical contact, and the thermal contact for a corresponding LED may comprise solderable metallization if necessary for soldering. Each LED in this fifth embodiment may also comprise a dielectric layer (e.g., LED dielectric layer 120C, LED dielectric layer 121C) disposed between the corresponding LED thermal contact and the LED active region, if necessary to electrically isolate the LED thermal contact from the LED. The LED thermal contact is relatively large: The area of an LED thermal contact is typically >50% of the area of the LED's bottom side (as shown in FIG. 12). The LED thermal contact may be electrically isolated from the first electrical contact and/or from the second electrical contact of the corresponding flip chip LED. Typically when the corresponding thermally conductive layer is electrically conductive, the LED thermal contact is electrically isolated from both the corresponding first electrical contact and second electrical contact, in order to electrically isolate each LED from the corresponding metal heat spreader. Except as noted already, the fifth embodiment of the present LED array comprises components disposed in the same configuration as in the second embodiment.

In a sixth embodiment of the present invention (FIG. 10), the LED array comprises the same components as the first embodiment, with the exception that each LED is a flip chip (e.g., flip chip LED 150, flip chip LED 151) attached with a corresponding set of reflowed solder bumps (e.g., solder bump set 170, solder bump set 171) to a first electrical contact (e.g., submount electrical contact 160C, submount electrical contact 161C) and a second electrical contact (e.g., submount electrical contact 160B, submount electrical contact 161B) on a top side of a corresponding thermally conductive LED submount (e.g., LED submount 160, LED submount 161). A first subset of these solder bumps electrically couples the corresponding submount's first electrical contact with an N-contact of the corresponding flip chip LED. Similarly a second subset of these solder bumps electrically couples the corresponding submount's second electrical contact with a P-contact of the corresponding flip chip LED. Initially the solder bump set may be fabricated on the corresponding submount's first electrical contact and second electrical contact, and subsequently this solder bump set may be re-flowed once the corresponding LED's N-contact and P-contact are disposed in direct contact with this solder bump set. Alternatively, the solder bump set may be initially fabricated on the corresponding LED's N-contact and P-contact, and subsequently this solder bump set may be re-flowed once the corresponding submount's first electrical contact and second electrical contact are disposed in direct contact with this solder bump set. The LED N-contact, the LED P-contact, and the corresponding submount's first electrical contact and second electrical contact comprise solderable metallization where the corresponding solder bumps are disposed. The solder bumps may comprise a tin/lead alloy or some other metal with good electrical and thermal conductivity and a suitable melting temperature. A bond wire (e.g., bond wire 90 and bond wire 92) is bonded at one end to a corresponding submount's first electrical contact (e.g., submount electrical contact 160C, submount electrical contact 161C) and is bonded at the other end to a corresponding metal pathway (e.g., metal pathway 40Z and metal pathway 40AD) of lead frame 40 which is adjacent to the corresponding submount. Another bond wire (e.g., bond wire 91 and bond wire 93) is bonded at one end to the corresponding submount's second electrical contact (e.g., submount electrical contact 160B, submount electrical contact 161B) and is bonded at the other end to another corresponding metal pathway (e.g., metal pathway 40X and metal pathway 40AB) of lead frame 40 which is adjacent to the corresponding submount. Each LED submount comprises thin, thermally conductive material, possibly silicon or ceramic 0.005"–0.010" thick, and metallization disposed on a bottom side that is a thermal contact (e.g., thermal contact 160A, thermal contact 161A). If the submount comprises semiconductor material, a dielectric layer may be disposed between submount metallization and the semiconductor material, if necessary, for electrical isolation. Each submount's thermal contact may comprise solderable metallization if the thermally conductive layer (e.g., thermally conductive layer 30, thermally conductive layer 31) disposed underneath comprises solder. Each submount's first electrical contact and second electrical contact comprise metallization which is suitable for wire bonding, disposed in areas where wires are bonded. Except as noted already, the sixth embodiment of the present LED array comprises components disposed in the same configuration as in the first embodiment.

Figure 13:
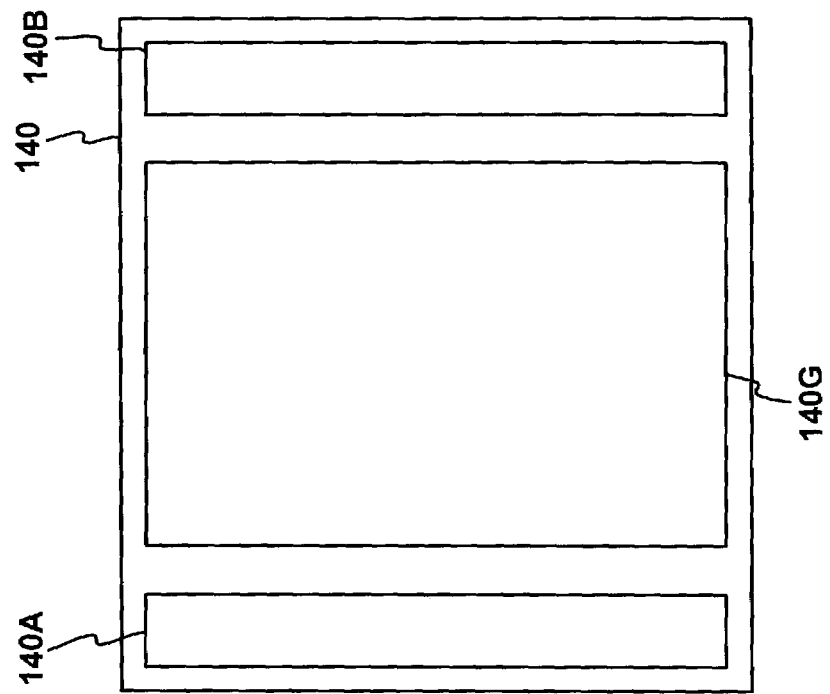
FIG. 13 illustrates a bottom side of an LED submount in accordance with a seventh embodiment and an eighth embodiment of the present invention.

In a seventh embodiment of the present invention (FIG. 11), the LED array comprises the same components as the sixth embodiment, with the exception that each LED submount (e.g., LED submount 140, LED submount 141) is electrically coupled to a corresponding pair of metal pathways of lead frame 40 with reflowed solder layers instead of bond wires. A first top electrical contact (e.g., submount top electrical contact 140C, submount top electrical contact 141C) disposed on a top side of an LED submount is electrically coupled with a first bottom electrical contact (e.g., submount bottom electrical contact 140A, submount bottom electrical contact 141A) disposed on a bottom side of the LED submount with a first electrical via (e.g., electrical via 140E, electrical via 141E). A second top electrical contact (e.g., submount top electrical contact 140D, submount top electrical contact 141D) disposed on a top side of the LED submount is electrically coupled with a second bottom electrical contact (e.g., submount bottom electrical contact 140B, submount bottom electrical contact 141B) disposed on a bottom side of the LED submount with a second electrical via (e.g., electrical via 140F, electrical via 141F). Each electrical via may comprise electrically conductive metal (e.g., titanium, tungsten, and/or copper) deposited in a submount hole by plating or other conventional metal deposition process. If the submount is fabricated from a semiconductor material, each via may also comprise a dielectric liner (e.g., silicon dioxide) conventionally deposited into the hole prior to metal deposition, in order to electrically isolate each via from the surrounding semiconductor material. A re-flowed solder layer (e.g., re-flowed solder layer 130, re-flowed solder layer 132) is disposed between the corresponding submount's first bottom electrical contact and an adjacent corresponding metal pathway (e.g., metal pathway 40Z, metal pathway 40AD) of lead frame 40. This metal pathway is thereby electrically coupled with an N-contact of a corresponding flip chip LED (e.g., flip chip LED 150, flip chip LED 151) attached to the corresponding submount with a corresponding set of solder bumps (e.g., solder bump set 170, solder bump set 171), as in the sixth embodiment. Another re-flowed solder layer (e.g., re-flowed solder layer 131, re-flowed solder layer 133) is disposed between the corresponding submount's second bottom electrical contact and another adjacent corresponding metal pathway (e.g., metal pathway 40X, metal pathway 40AB) of lead frame 40. This other metal pathway is thereby electrically coupled with a P-contact of the corresponding flip chip LED attached to the corresponding submount with the corresponding set of solder bumps, as in the sixth embodiment. In an alternate embodiment, electrically conductive adhesive layers, such as silver-filled epoxy instead of solder, may electrically couple each LED submount with corresponding metal pathways of lead frame 40. The bottom side of each LED submount also comprises a thermal contact (e.g., submount thermal contact 140G, submount thermal contact 141G) that is in direct thermal contact with thermally conductive material (e.g., thermally conductive layer 30, thermally conductive layer 31). Each thermally conductive layer is also in direct thermal contact with a corresponding metal heat spreader (e.g., metal heat spreader 60, metal heat spreader 61). Each thermally conductive layer structurally and thermally couples a corresponding LED submount with a corresponding metal heat spreader. The electrical contacts and the thermal contact for a corresponding LED submount may comprise solderable metallization wherever solder is disposed. The submount thermal contact is relatively large: The area of a submount thermal contact is typically >50% of the area of the submount's bottom side (as shown in FIG. 13). The submount thermal contact may be electrically isolated from the first bottom electrical contact and/or from the second bottom electrical contact of the corresponding LED submount. Typically when the corresponding thermally conductive layer is electrically conductive, the submount thermal contact is electrically isolated from both the corresponding first bottom electrical contact and second bottom electrical contact, in order to electrically isolate each LED from the corresponding metal heat spreader. If the submount comprises semiconductor material, a dielectric layer may be disposed between the submount thermal contact metallization and the semiconductor material, if necessary, for electrical isolation. Except as noted already, the seventh embodiment of the present LED array comprises components disposed in the same configuration as in the sixth embodiment.

In an eighth embodiment of the present invention (FIG. 14), the LED array comprises the same components as the seventh embodiment, with the exception that each metal heat spreader (e.g., metal pathway 43W, metal pathway 43AA, metal pathway 43AE, metal pathway 43AJ) disposed underneath a corresponding LED is an integral part of the metal lead frame (e.g., lead frame 43), and a separate plastic base (e.g., plastic base 180, plastic base 181, plastic base 182, plastic base 183) is disposed underneath each corresponding metal heat spreader. Each plastic base may be molded simultaneously with a corresponding lens (e.g., lens 70, lens 71) disposed above as a single piece of clear dielectric material. Some of this dielectric material in the base electrically and spatially separates the corresponding metal heat spreader from adjacent electrical current pathways (e.g., metal pathway 43Z and metal pathway 43X; metal pathway 43AD and metal pathway 43AB) of lead frame 43. A set of holes (e.g., hole 43BJ, hole 43BK, hole 43BL, and hole 43BM; hole 43BN, hole 43BP, hole 43BQ, and hole 43BR; hole 43BY, hole 43BS, hole 43BT, and hole 43BU; hole 43BW, hole 43BX, hole 43BY, and hole 43BZ; shown in FIG. 15) disposed in lead frame 43 between a plastic base and a corresponding lens facilitates the flow of plastic between the plastic base and lens during molding. The lead frame 43 comprises tie bars (e.g., tie bar 43J, tie bar 43A, tie bar 43D, tie bar 43E, tie bar 43H, tie bar 43R, tie bar 43K, tie bar 43L, tie bar 43M, tie bar 43N, tie bar 43P, tie bar 43Q, tie bar 43S, tie bar 43T, tie bar 43U, tie bar 43V, tie bar 43AN, tie bar 43AP, tie bar 43AS, tie bar 43AT, tie bar 43AX, tie bar 43AW, tie bar 43AY, tie bar 43AZ, tie bar 43BA, tie bar 43BB, tie bar 43BC, tie bar 43BE, tie bar 43BD, tie bar 43BG, tie bar 43BH, tie bar 43BF) which connect lead frame metal pathways, and some or all lead frame tie bars (e.g., tie bar 43R) have a C shaped bend for stress relief, similar to lead frame 42 in the fourth embodiment of the LED array. In alternate embodiments, each lead frame tie bar may have a V shaped bend or S shaped bend or some other bend suitable for stress relief instead. As noted in other embodiments, some tie bars (e.g., tie bar 43A, tie bar 43D, tie bar 43E, tie bar 43H, tie bar 43L, tie bar 43P, tie bar 43Q, tie bar 43V, tie bar 43AN, tie bar 43AS, tie bar 43AT, tie bar 43AW, tie bar 43AZ, tie bar 43BC, tie bar 43BE, tie bar 43BH) of lead frame 43 are removed after molding the lenses onto lead frame 43, in order to create a suitable LED array circuit configuration. Except as noted already, the eighth embodiment of the present LED array comprises components disposed in the same configuration as in the seventh embodiment.

Figure 15:
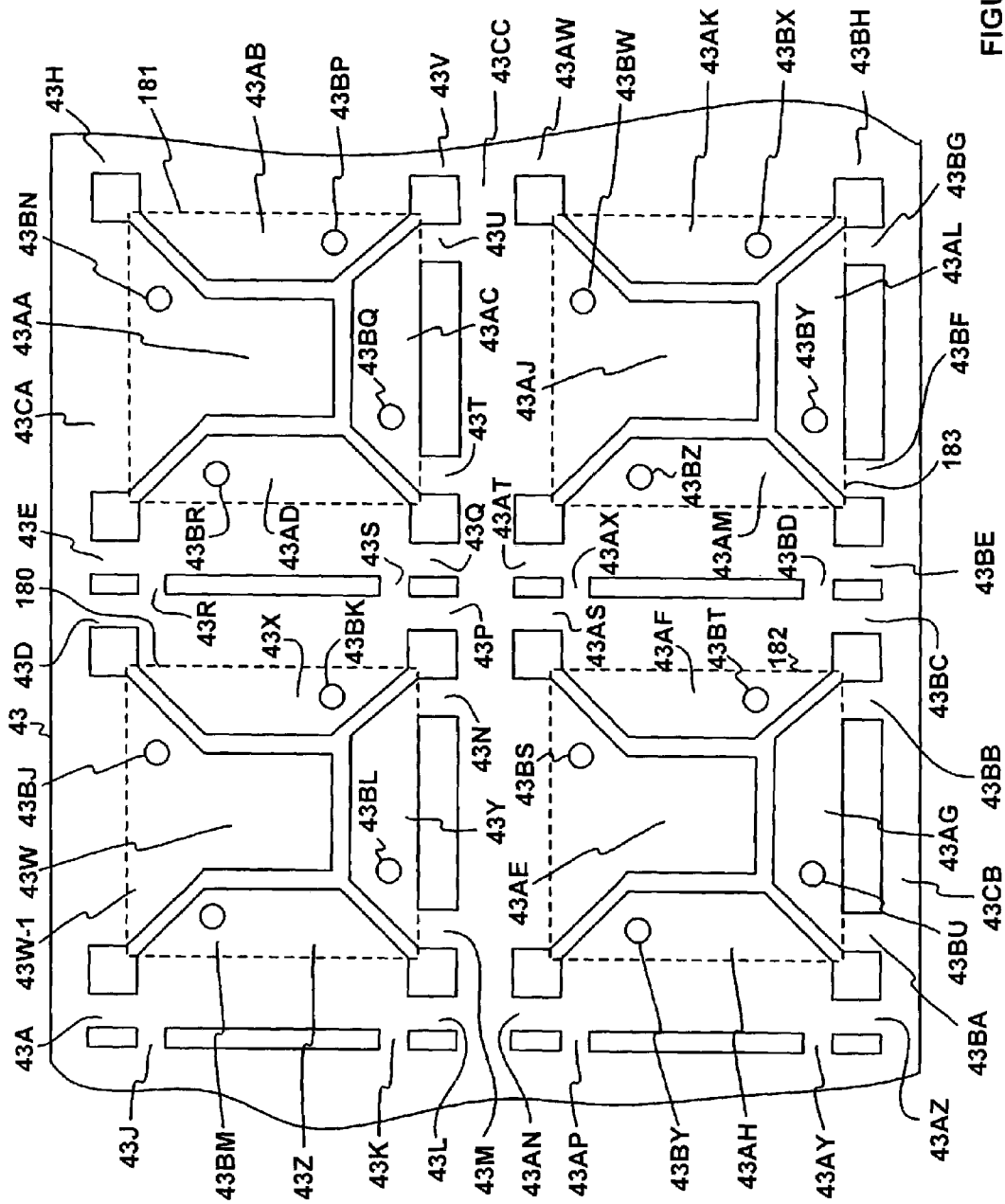
FIG. 15 illustrates in a top view a portion of a metal lead frame, with molded plastic lamp bases underneath, in accordance with an eighth embodiment of the present invention.

Some large metal pathways of lead frame 43 (e.g., metal pathway 43CA, metal pathway 43CC, metal pathway 43CB) are directly connected to the lead frame's heat spreaders (e.g., metal pathway 43W, metal pathway 43AA, metal pathway 43AE, metal pathway 43AJ), as shown in FIG. 15. These large metal pathways may be thermally and structurally coupled to a metal base which functions as a heat sink. Together these large metal pathways and the lead frame's heat spreaders provide a thermally conductive pathway for heat to flow from each LED in the array to a heat sink base. Unlike adjacent metal pathways, which are structurally coupled together with corresponding tie bars disposed between them, each heat spreader of lead frame 43 is structurally connected directly to a corresponding large metal pathway. The region where each heat spreader is connected to a corresponding large metal pathway is relatively wide in order to increase the thermal conductivity. Each heat spreader (e.g., metal pathway 43W) comprises a heat spreading region (e.g., heat spreading region 43W-1) that widens as the distance from the corresponding LED increases. This region is a heat transfer area with a surface much larger than the bottom of the corresponding LED die. Prior to removal of some tie bars, lead frame 43 is a single metal piece comprising heat spreaders, other metal pathways, and tie bars.

In the eighth embodiment of the present LED array, each heat spreader (e.g., metal pathway 43W) is electrically isolated from adjacent metal pathways (e.g., metal pathway 43Z and metal pathway 43X) that are electrically coupled to the corresponding LED (e.g., flip chip LED 150). In other embodiments, each heat spreader may be a metal pathway that is electrically coupled to a corresponding LED. For example, LED submount 140 may be disposed with both thermal contact 140G and bottom electrical contact 140B above leadframe heat spreader 43W. A thermally and electrically conductive material, such as solder or silver-filled epoxy, may structurally couple these two submount contacts to lead frame heat spreader 43W. In this configuration, each metal heat spreader (e.g., metal pathway 43W, metal pathway 43AA) is structurally and electrically integrated with a corresponding electrical current pathway (e.g., metal pathway 43CA, which may be a thermal pathway and also a cathode or anode bus for LEDs electrically connected in parallel) as a single metal piece. In this configuration, the submount's bottom electrical contact 140A is disposed above adjacent metal pathway 43Y and is structurally coupled to it with electrically conductive material. In an alternate embodiment of an LED submount, a bottom electrical contact may be combined with a thermal contact as a relatively large, integrated thermal/electrical contact.

Figure 14:
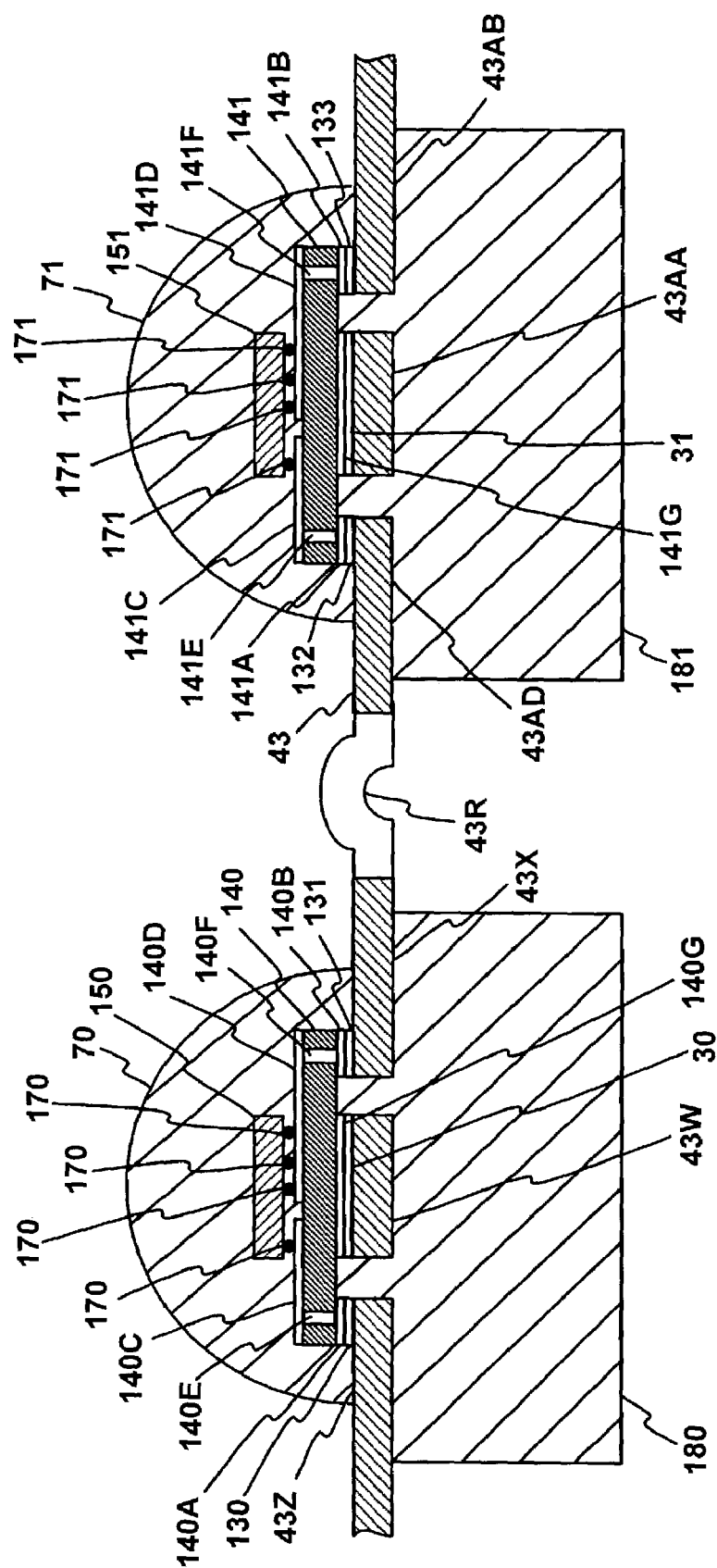
FIG. 14 schematically illustrates a portion of an LED array in accordance with an eighth embodiment of the present invention.

As shown in FIG. 14, the thickness of each heat spreader is identical to the other metal pathways and tie bars of lead frame 43. In an alternate lead frame, the thickness of each heat spreader (possibly 0.025"–0.100" thick) may be greater than the other metal pathways and tie bars (possibly 0.005"–0.015" thick). Such a lead frame may be stamped or etched from a single piece of metal with thick regions and thin regions. Alternatively metal plates may be soldered, brazed, welded, or otherwise conventionally attached (e.g., with adhesive) to the lead frame either before or after the lead frame stamping or etching process. A ninth embodiment of the present LED array may comprise this alternate lead frame in combination with the other components of the eighth embodiment. In this ninth embodiment, each heat spreader is thick enough that a bottom side of each heat spreader is exposed underneath each corresponding plastic base: Each heat spreader extends through the corresponding plastic base. The exposed bottom side of each heat spreader may be thermally and structurally coupled to a common base that functions as a heat sink, such as the configuration shown in FIG. 8. This ninth embodiment of the present LED array may dissipate the LEDs heat more effectively than the eighth embodiment because each heat spreader may be disposed very close to a heat sink, with a thin layer of thermally conductive material structurally coupling each heat spreader to this heat sink. This configuration improves thermal conductivity. Except as noted already, the ninth embodiment of the present LED array comprises components disposed in the same configuration as in the eighth embodiment.

Figure 18:
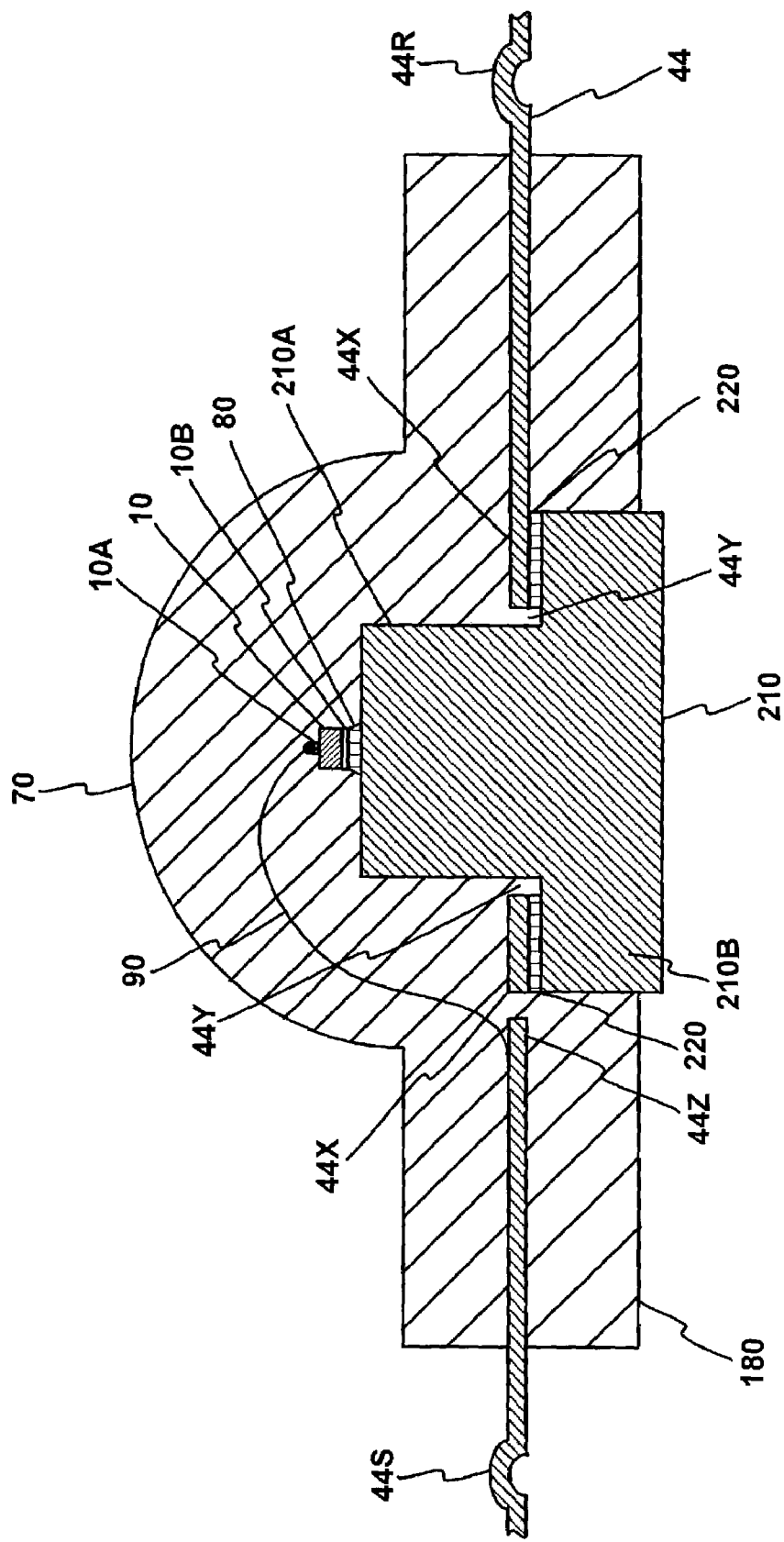
FIG. 18 schematically illustrates a portion of an LED array in accordance with a tenth embodiment of the present invention.

Although the eighth embodiment and ninth embodiment of the present LED array comprises flip chip LEDs soldered to corresponding LED submounts, similar embodiments of the present LED array may comprise alternate configurations of LEDs with and without corresponding LED submounts. The LED and LED submount configurations of the first embodiment, second embodiment, third embodiment, fifth embodiment, and sixth embodiment may be used in combination with the lead frame, lenses, and plastic bases of the eighth embodiment or the ninth embodiment. For example, FIG. 18 illustrates a portion of an LED array comprising a conventional LED die 10, bond wire 90, and electrically conductive die attach layer 80 in a configuration identical to the third embodiment of the present invention, and this LED array comprises a clear molded lens 70, molded plastic base 180, heat spreader 210, and metal lead frame 44 in a configuration identical to the ninth embodiment of the present invention. In this tenth embodiment, a typical metal heat spreader 210 comprises a circular plate base 210B with a coaxial cylinder 210A disposed above it, which is similar to metal heat spreader 200 (shown in FIG. 17) except there is no concave reflector cavity. The flat top of this coaxial cylinder 210A may comprise an optically reflective surface, possibly silver plating, which redirects some light rays from the corresponding LED. The diameter of the coaxial cylinder 210A may be smaller than the diameter of the circular plate base 210B. Lead frame 44 comprises a metal pathway 44X which is electrically coupled with bottom electrical contact layer 10B of LED 10 via electrically conductive die attach layer 80, metal heat spreader 210, and an electrically conductive layer 220 such as silver-filled epoxy or solder which structurally attaches metal pathway 44X to the circular plate base 210B of metal heat spreader 210. The coaxial cylinder 210A of heat spreader 210 is centered within thru hole 44Y of metal pathway 44X. The diameter of thru hole 44Y is marginally larger than the diameter of coaxial cylinder 210A. Metal pathway 44Z of lead frame 44 is electrically coupled to bond pad 10A of LED die 10 via bond wire 90, and a gap physically separates metal pathway 44Z from metal pathway 44X. As in the eighth and ninth embodiments of the present invention, enclosed portions of several electrical current pathways (metal pathway 44Z and metal pathway 44X) of lead frame 44 are encapsulated within a corresponding dielectric body (molded lens 70 and molded plastic base 180), as shown in FIG. 18. An enclosed portion of the corresponding metal heat spreader 210 is also encapsulated within this dielectric body. An exterior portion of this heat spreader 210, at the bottom, is externally disposed outside this corresponding dielectric body, similar to the ninth embodiment. This lens 70 and base 180 comprise clear molding compound which is a dielectric material, and this dielectric material fills some gaps between adjacent electrical current pathways of lead frame 44, such as the gap between metal pathway 44Z and metal pathway 44X. This dielectric material also fills the gap between one electrical current pathway (e.g., metal pathway 44Z) and the corresponding heat spreader (e.g., metal heat spreader 210) within the molded base. The LED lamp shown in FIG. 18 is electrically coupled to one or more adjacent LED lamps, which each may comprise a similar configuration of components, to form an array of LEDs in accordance with this tenth embodiment. The lead frame 44, which provides the electrical connections between LEDs in this array, may comprise mechanical stress relief features between some or all adjacent LEDs such as C shaped bends in tie bar 44R and tie bar 44S, which are identical to stress relief features of the eighth embodiment of the present invention. It should be noted that although the LED lamp shown in FIG. 18 comprises a lens 70 and base 180 which are molded together as one integrated dielectric body, in alternate embodiments each LED lamp's dielectric body may consist of a molded base enclosing portions of a corresponding heat spreader and portions of corresponding electrical current pathways. In such alternate embodiments, each LED lamp may comprise a separate molded lens which encloses the LED die.

In one variation of the tenth embodiment, each heat spreader's base may be sufficiently large that a portion of it is disposed underneath both corresponding electrical current pathways. In this configuration, some of the dielectric body's molding compound is disposed between the bottom of one corresponding electrical current pathway (e.g., metal pathway 44Z) and the top of the corresponding heat spreader's base. Thus the molding compound in the dielectric body forms a dielectric layer between one correspond electrical current pathway and the underlying portion of the corresponding heat spreader, whereby the heat spreader and that electrical current pathway are electrically isolated from each other. In other embodiments of the present invention, some material in each dielectric body provides dielectric layer(s) disposed between portions of multiple corresponding electrical current pathways and underlying portions of the corresponding heat spreader. Such dielectric layers may be created during molding of each dielectric body over portions of the lead frame. A portion of each metal heat spreader may also molded inside the corresponding dielectric body at the same time, or each metal heat spreader subsequently may be inserted into a cavity in this dielectric body to create a similar configuration. The dielectric body in these variations of the present invention may comprise a molded base with or without a molded lens.

Although the first embodiment, second embodiment, third embodiment, fourth embodiment, sixth embodiment, and tenth embodiment of the present LED array all comprise metal heat spreaders each with a flat top side and a flat bottom side, alternatively these embodiments may comprise metal heat spreaders (e.g., metal heat spreader 200, shown in FIG. 17) each with a concave reflector cavity (e.g., reflector cavity 200B). An LED with or without a corresponding submount is disposed on a flat bottom face of the reflector cavity in a corresponding metal heat spreader. Each metal heat spreader may comprise a cylinder (e.g., heat spreader cylinder 200A) disposed above a wider base (e.g. heat spreader base 200C), with the concave reflector cavity disposed inside this cylinder facing upwards. This concave reflector cavity comprises an optically reflective surface, possibly silver plating, which redirects some of the corresponding LED's light rays. This concave reflector cavity and the corresponding lens determine the corresponding LED's radiation pattern. The heat spreader's cylinder passes through a via in the corresponding dielectric layer disposed above the heat spreader's base. Each heat spreader comprises a single piece of thermally conductive metal, such as copper, which is stamped, cast, or machined and subsequently may be plated to reduce corrosion, to improve solderability, or to improve bondability for bond wire attachment if necessary.

Figure 5:
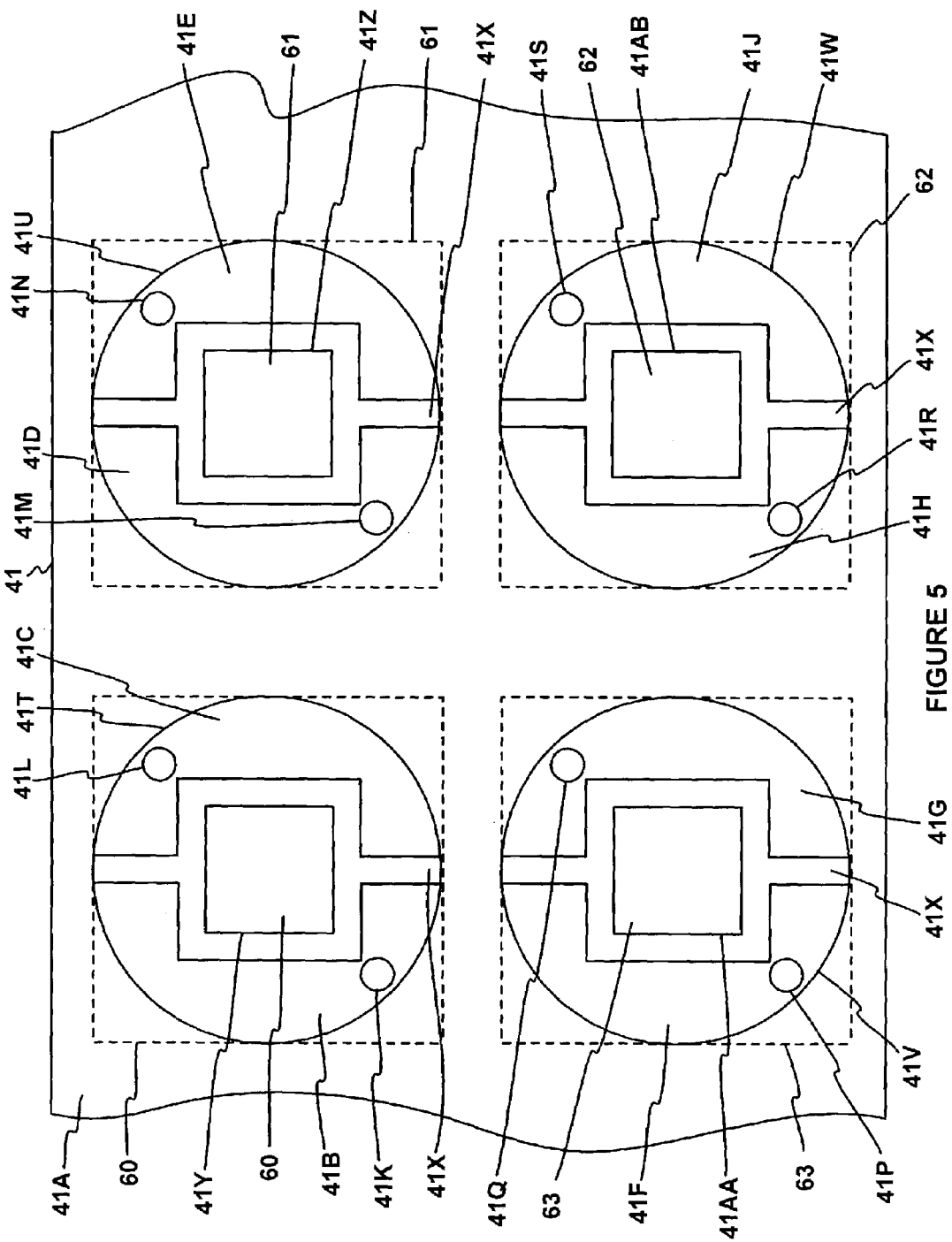
FIG. 5 illustrates in a top view a portion of a bendable printed circuit board or flex circuit, with metal heat spreaders underneath, which may be used instead of a metal lead frame in accordance with a first embodiment, a second embodiment, a third embodiment, a fourth embodiment, a fifth embodiment, a sixth embodiment, and a seventh embodiment of the present invention.

Although FIG. 1, FIG. 2, FIG. 3, FIG. 4, FIG. 6, FIG. 8, FIG. 9, FIG. 10, FIG. 11, FIG. 14, FIG. 15, and FIG. 18 show embodiments that comprise a metal lead frame, embodiments of the present LED array may comprise a flex circuit, a flexible printed circuit board, or a thin, bendable printed circuit board instead. Bendable electrical interconnection layer 41 (FIG. 5) comprises a set of metal traces (e.g., trace 41B, trace 41C, trace 41D, trace 41E, trace 41F, trace 41G, trace 41H, trace 41J, etc.), a bendable bottom dielectric layer 41X disposed underneath the set of metal traces, and an optional bendable top dielectric layer 41A disposed above the set of metal traces. The bendable bottom dielectric layer 41X comprises a first set of vias (e.g., via 41Y, via 41Z, via 41AA, via 41AB, etc.), and each via contains a thermally conductive material, such as silver-filled epoxy or solder, disposed between a corresponding metal heat spreader (e.g., metal heat spreader 60, metal heat spreader 61, metal heat spreader 62, metal heat spreader 63) underneath and a corresponding LED or LED submount above. Each metal heat spreader may be disposed underneath the bendable bottom dielectric layer 41X, as shown in FIG. 5, prior to deposition of thermally conductive material inside each via. An adhesive, such as epoxy, may be disposed between each metal heat spreader and the bendable bottom dielectric layer 41X in order to structurally couple each heat spreader to this bottom dielectric layer 41X. The optional bendable top dielectric layer 41A comprises a second set of vias (e.g., via 41T, via 41U, via 41V, via 41W, etc.). Each via in this second set of vias is disposed directly above a corresponding via in the first set of vias, as shown in FIG. 5. Each via in this second set is larger than the corresponding via in the first set, and there are two separate corresponding metal traces (e.g., trace 41B and trace 41C) exposed inside each via (e.g., via 41T) which are electrically coupled to the corresponding LED with bond wires or electrically conductive material, such as solder or silver-filled epoxy. The set of metal traces in electrical interconnection layer 41 are interconnected such that they electrically couple corresponding LEDs in series, in parallel, in anti-parallel, or in some other suitable electrical configuration, similar to other embodiments previously described. These metal traces are electrical current pathways which carry electricity to the LEDs when the array is suitably coupled to an electrical power supply. The bendable bottom dielectric layer 41X and the bendable top dielectric layer 41A may comprise dielectric material typically used in flex circuits, such as 0.002"–0.010" thick polyimide. Alternately the bendable bottom dielectric layer 41X may comprise thin (e.g., 0.004"–0.010") dielectric material typically used in printed circuit boards, and the bendable top dielectric layer 41A may comprise a thin (e.g., 0.001"–0.005") solder mask material. The set of metal traces may comprise metal, such as 0.0007"–0.0028" thick copper, typically used in flex circuits or printed circuit boards that is first etched to form separate traces and subsequently is plated with one or more metal layers suitable for bond wire adhesion (e.g., gold layer over nickel layer) or suitable for solder adhesion (e.g., a tin/lead alloy layer). The exposed metal traces (e.g., trace 41B and trace 41C) within a corresponding via (e.g., via 41T) of the top dielectric layer 41A may be separated at a distance (e.g., 0.002"–0.020") from the corresponding via (e.g., via 41Y) of the bottom dielectric layer 41X. This may be necessary for electrical isolation between these traces if the thermally conductive material within the corresponding via of the bottom dielectric layer 41X is electrically conductive. The bendable electrical interconnection layer 41 may comprise two or more through holes (e.g., hole 41K, hole 41L, hole 41M, hole 41N, hole 41P, hole 41Q, hole 41R, hole 41S, etc.) disposed within each via of the top dielectric layer 41A. A plastic, elastomer, or gel may flow through these holes during encapsulation of each LED within a corresponding lens, as described previously. In embodiments where each lens of the LED array comprises several pegs disposed underneath for heat staking (e.g., lens 190, FIG. 16), the pegs of each lens are disposed through corresponding holes in bendable electrical interconnection layer 41 and through corresponding holes in each metal heat spreader.

As shown in FIG. 5, embodiments comprising a flex circuit, flexible printed circuit board, or a bendable printed circuit board attached to underlying metal heat spreaders may have an opening in the metal traces and dielectric layer(s) above each heat spreader. A first portion of this opening is created by a via (e.g., via 41Y) through the corresponding dielectric layer (e.g., dielectric layer 41X) attached to a first portion of the corresponding heat spreader's (e.g., heat spreader 60) top surface. A second portion of this opening is created by the gap between adjacent metal traces (e.g., metal trace 41B and metal trace 41C) of the electrical interconnection layer (e.g., electrical interconnection layer 41). These adjacent metal pathways are disposed above a first portion of the corresponding dielectric layer (dielectric layer 41X). There is at least one such opening disposed over each metal heat spreader. One or more thermally conductive materials (e.g., thermally conductive layer 30, submount 20, and die attach layer 80) are disposed above a second portion of the corresponding heat spreader's (e.g., heat spreader 60) top surface and are disposed underneath the corresponding LED die (e.g., LED 10). One of these thermally conductive materials (e.g., thermally conductive layer 30) is thermally coupled directly to this second portion of the corresponding heat spreader's top surface, and one of these thermally conductive materials (e.g., die attach layer 80) is thermally coupled directly to the bottom surface of the corresponding LED die.

Figure 2:
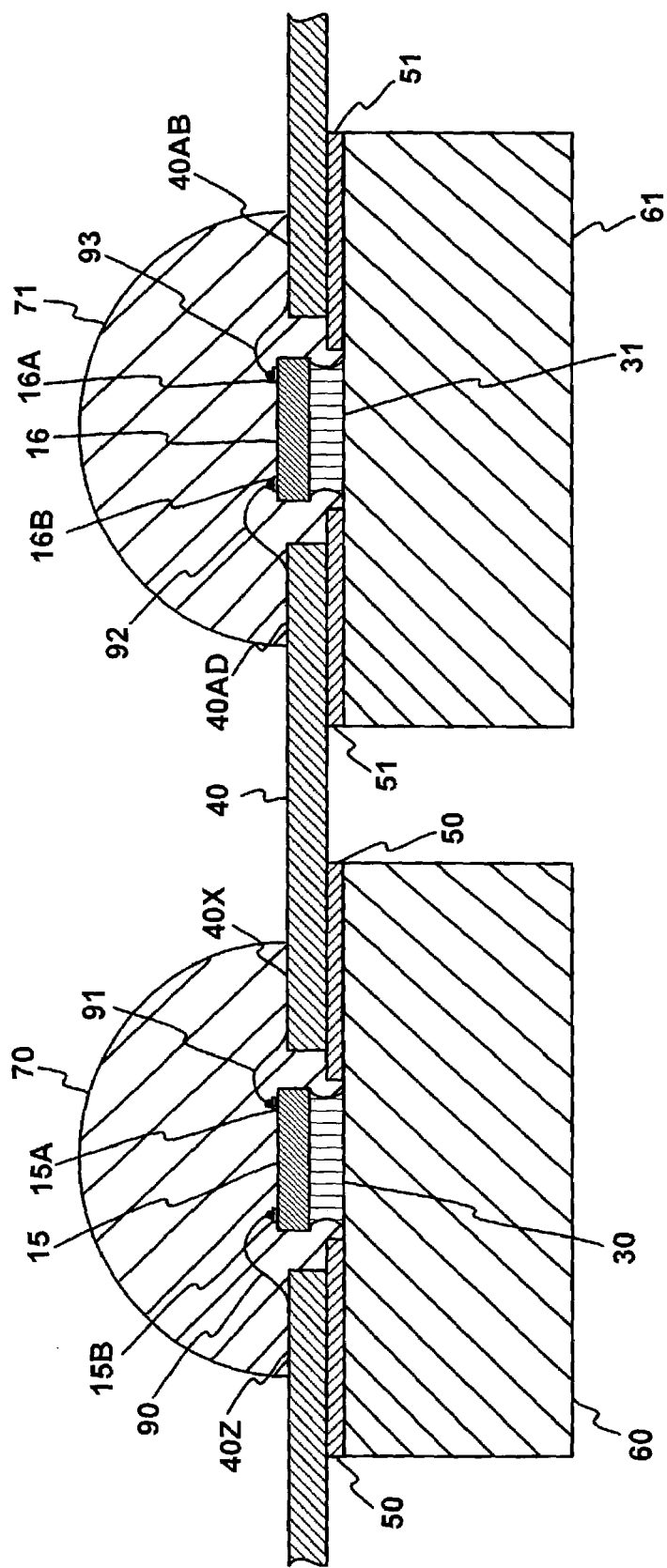
FIG. 2 schematically illustrates a portion of an LED array in accordance with a second embodiment of the present invention.
Figure 9:
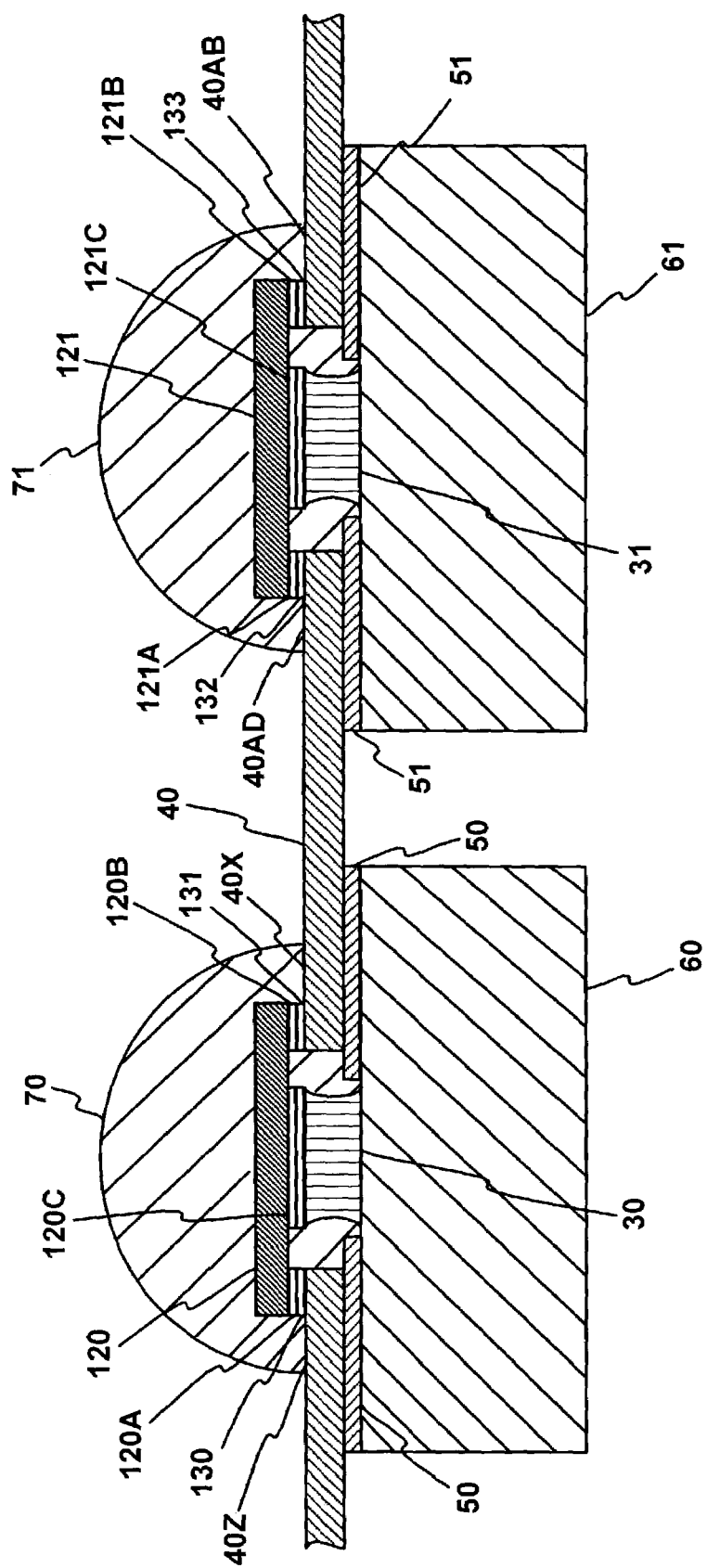
FIG. 9 schematically illustrates a portion of an LED array in accordance with a fifth embodiment of the present invention.
Figure 10:
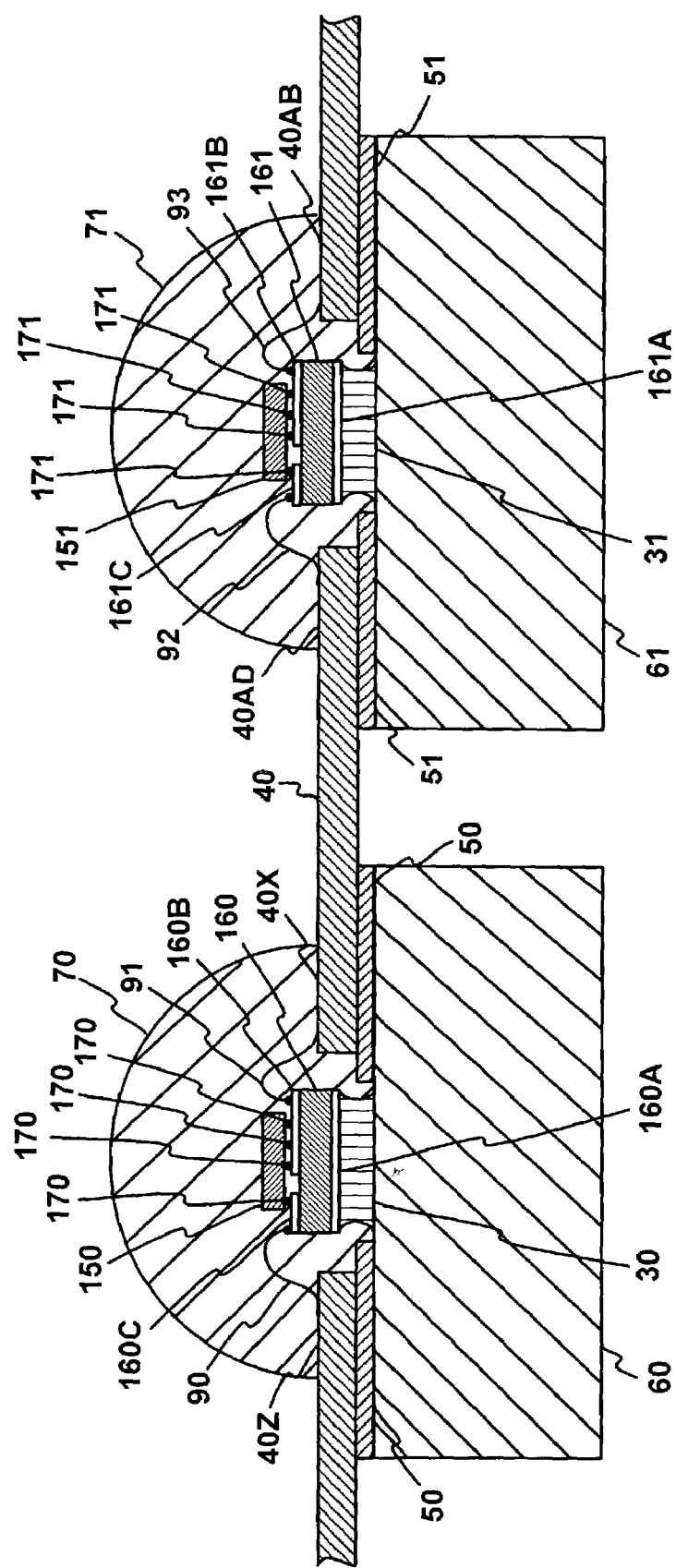
FIG. 10 schematically illustrates a portion of an LED array in accordance with a sixth embodiment of the present invention.
Figure 11:
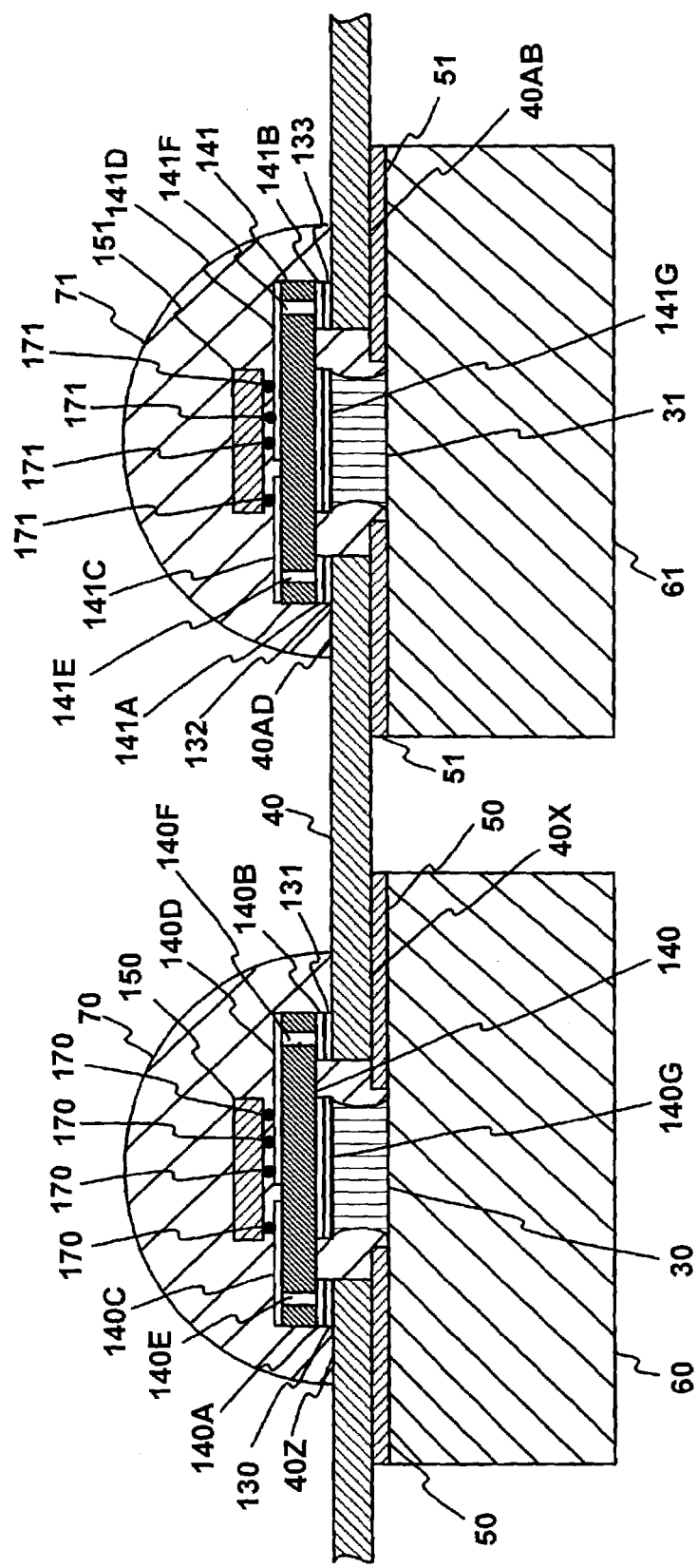
FIG. 11 schematically illustrates a portion of an LED array in accordance with a seventh embodiment of the present invention.

Each LED in the present LED array may be a conventional LED with two electrical contacts. One electrical contact is electrically coupled with an N-type region of the LED, and the other electrical contact is electrically coupled with a P-type region of the LED. In the first embodiment, third embodiment, and fourth embodiment of the present LED array, one electrical contact is disposed on a top side of the LED as a bond pad, and the other electrical contact is a metallized layer disposed on a bottom side of the LED. In the second embodiment of the present LED array, the two electrical contacts are both bond pads disposed on a top side of the LED. In the fifth embodiment, sixth embodiment, seventh embodiment, and eighth embodiment of the present LED array, the two electrical contacts are both disposed on a bottom side of a flip chip LED. LED bond pads comprise conventional metallization suitable for attaching bond wires. Each electrical contact on a bottom side of an LED may comprise conventional metallization suitable for solder adhesion if solder is disposed there instead of an electrically conductive adhesive. One embodiment of a suitable flip chip LED comprises multiple solder (e.g., tin/lead alloy) bumps deposited on each of the two electrical contacts during initial fabrication of the flip chip LED. These solder bumps are subsequently re-flowed after the flip chip LED is disposed above a corresponding LED submount during assembly. In another embodiment, an LED submount comprises multiple solder bumps deposited on each of two top electrical contacts of the submount during fabrication, and these solder bumps are subsequently re-flowed after a corresponding flip chip LED is disposed above the LED submount during assembly. In some implementations, these solder bumps have a higher re-flow temperature than solder in the thermally conductive layer disposed underneath each submount, allowing each submount to be soldered to a corresponding heat spreader without disturbing the solder connections between the submount and the corresponding LED. Each LED in the present LED array comprises a thermal contact deposited on a bottom side of the LED. The LED thermal contact may be spatially separated from both LED electrical contacts, as shown in FIG. 2, FIG. 9, and FIG. 12. Alternatively the LED thermal contact may be integrated with an electrical contact on a bottom side of the LED (as shown in FIG. 1, FIG. 3, FIG. 6, FIG. 10, FIG. 11, and FIG. 14), whereby at least one LED electrical contact also functions as a thermal contact. Typically the LED thermal contact is a metallized pad or metallized layer that has good thermal conductivity. Alternatively the LED thermal contact may be a deposited dielectric layer or exposed semiconductor material on a bottom side of the LED. The present LED array may comprise AlInGaN LEDs (e.g., LED disclosed in U.S. Pat. No. 6,133,589, LED disclosed in U.S. patent application Ser. No. 09/469,657, both of which are incorporated herein by reference in their entirety), AlInGaP LEDs, AlGaAs LEDs, and/or other semiconductor LEDs. In order to maximize the flux emitted by the present LED array, each LED may be relatively large (e.g., >0.5 mm×0.5 mm) and relatively efficient (e.g., wall plug efficiency >4%), such as some high flux LEDs produced by LumiLeds Lighting U.S., LLC of San Jose, Calif. Alternatively the present LED array may comprise smaller or less efficient LEDs. The present LED array may comprise a combination of different types of LEDs within the array, such as red AlInGaP LEDs, green AlInGaN LEDs, and blue AlInGaN LEDs.

An LED submount allows incorporation of additional circuitry onboard and allows testing of a corresponding LED prior to installation into the present LED array, which are two key advantages of LED array embodiments comprising LED submounts. An LED submount comprising silicon may be fabricated with conventional integrated circuit fabrication processes to form metallization on a top side and on a bottom side. Electrically conductive vias may be fabricated through the silicon, if necessary, with processes developed by companies such as Tru-Si Technologies. In addition, conventional integrated circuit fabrication processes may create electrostatic discharge protection circuitry (e.g., internal Zener diodes in an anti-parallel circuit configuration electrically coupled to two corresponding electrical contacts of the submount) or an internal current-limiting resistor electrically coupled to two corresponding electrical contacts of the submount. Such onboard circuitry within an LED submount is electrically coupled to the corresponding LED, in a conventional circuit configuration, in order to protect this LED from excessive voltages or currents. LED submounts with multiple electrical contacts, such as submount 160 or submount 140, are suitable for such onboard circuitry. Once an LED is structurally and electrically coupled to a corresponding submount, the LED may be more readily electrically and optically tested than when the LED is in wafer form (either before or after wafer sawing).

Figure 20:
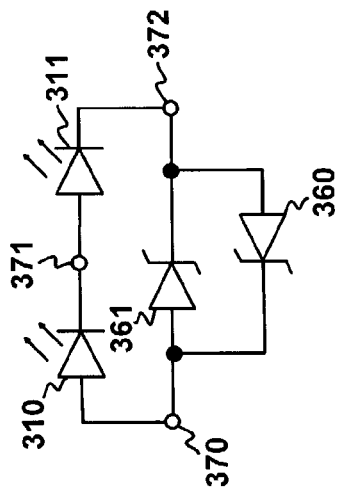
FIG. 20 shows an electrical schematic diagram of a circuit onboard one embodiment of an LED submount with two LED dice attached, in accordance with the present invention.

FIG. 20 shows an electrical schematic diagram of a circuit onboard one embodiment of an LED submount with two LED dice attached. This submount has two internal Zener diodes (Zener diode 360 and Zener diode 361) electrically connected in an anti-parallel configuration for protection against electrostatic discharge damage to the LEDs. These two internal Zener diodes are connected to two corresponding electrical contacts (electrical contact 370 and electrical contact 372) of this submount. These two electrical contacts plus a third electrical contact (electrical contact 371) of this LED submount are electrically connected to two LED dice (LED 310 and LED 311) in a series configuration. Thus this embodiment of an LED submount includes an electrical circuit pathway that comprises three electrical contacts, two internal Zener diodes, and onboard metallization which electrically interconnects these elements. This electrical circuit pathway is electrically coupled to the two corresponding LED dice attached to the LED submount. Two of this submount's electrical contacts (electrical contact 370 and electrical contact 372) may be electrically coupled, possibly with bond wires, to two separate corresponding electrical current pathways of the electrical interconnection layer. This configuration illustrates that some embodiments of the present invention comprise at least some LED dice which may be electrically coupled indirectly, via other components, to corresponding electrical current pathways (e.g., The cathode of LED 310 is connected to the submount's electrical contact 371, which is not connected directly to any electrical current pathway.) of the electrical interconnection layer. Although this submount embodiment comprises an electrical circuit pathway suitable for electrically connecting several LED dice in series, other submount embodiments in accordance with the present invention comprise electrical circuit pathways suitable for electrically connecting multiple LED dice in parallel or in anti-parallel configurations.

The present LED array's bendable electrical interconnection layer may be fabricated using conventional processes. In embodiments comprising a metal lead frame, a sheet of metal may be etched or stamped to create metal pathways, tie bars, and holes in a lead frame. Subsequently some or all of the tie bars may be bent to form stress relief features, although this process is not always necessary. Either before or after bending the tie bars, the lead frame may be plated, possibly with bondable or solderable plating where necessary. In embodiments comprising a flex circuit or bendable printed circuit board, a metal foil is attached above a bottom dielectric layer. This bottom dielectric layer may have adhesive properties such that it adheres to the metal foil, or an adhesive layer may be deposited between the metal foil and the dielectric layer. Subsequently this adhesive layer is cured, if necessary, to strengthen the adhesion between the metal foil and the bottom dielectric layer. Then the metal foil may be conventionally etched to form electrically conductive traces. Subsequently an optional top dielectric layer may be attached above the metal foil. This top dielectric layer may have adhesive properties such that it adheres to the metal foil, or an adhesive layer may be deposited between the metal foil and the top dielectric layer. Subsequently this adhesive layer is cured, if necessary, to strengthen the adhesion between the metal foil and the top dielectric layer. Either before or after the dielectric layers have been attached to the metal foil, through holes and vias may be formed in each dielectric layer via punching, etching, drilling, milling, or another conventional process. Once the top dielectric layer is attached and vias have been formed in this layer to expose some metal traces, the exposed metal traces may be plated, possibly with bondable or solderable plating where necessary, or solder may be applied onto exposed metal traces with some other conventional process. Although one sequence of processes has been described for fabricating a suitable flex circuit or printed circuit board, other conventional fabrication processes commonly used to produce flex circuits or printed circuit boards may be used instead.

The metal heat spreaders may be initially formed by stamping, casting, sawing, extruding, machining, or some other conventional metal forming processes. These heat spreaders comprise a thermally conductive metal, such as copper or aluminum, possibly 0.025"–0.100" thick. Subsequently these metal heat spreaders may be plated, possibly with bondable (e.g., gold over nickel) or solderable (e.g., tin, tin/lead) metallization, or anodized, if necessary. In some implementations, plating may occur after a dielectric layer is attached to each heat spreader, whereby plated metallization partially or completely fills each via in the dielectric layer.

After the bendable electrical interconnection layer and the metal heat spreaders are fabricated, the metal heat spreaders are structurally attached underneath the bendable electrical interconnection layer. In embodiments comprising a lead frame, a dielectric adhesive layer may be initially deposited onto a bottom side of the lead frame or onto a top side of each metal heat spreader. In embodiments comprising a flex circuit, flexible printed circuit board, or a bendable printed circuit board, an adhesive layer may be initially deposited onto a bottom side of the bottom dielectric layer or onto a top side of each metal heat spreader. If the bottom dielectric layer of the flex circuit or printed circuit board has adhesive properties, however, depositing an adhesive layer may be optional. A variety of conventional adhesive deposition processes may be used, such as screen printing, stencil printing, needle dispensing, adhesive preform placement, et cetera. Typically the process selectively deposits adhesive only where needed for attaching each metal heat spreader to the lead frame, flex circuit, or printed circuit board, such that there is a via in the adhesive layer above each metal heat spreader. After the adhesive is initially deposited, the heat spreaders are placed adjacent to a bottom side of the lead frame, flex circuit, or printed circuit board, such that the adhesive is in direct contact with the heat spreaders and with the lead frame, flex circuit, or printed circuit board. Subsequently the adhesive may be cured by heat or other suitable means, if necessary. In the eighth embodiment of the present LED array, no adhesive is needed for attaching the metal heat spreaders to the leadframe because the heat spreaders and lead frame are initially fabricated together as single metal piece.

After the metal heat spreaders are structurally attached underneath the bendable electrical interconnection layer, LED assemblies (one or more LEDs with or without a corresponding submount) are structurally attached to corresponding metal heat spreaders and are electrically coupled to the bendable electrical interconnection layer. In embodiments without LED submounts, thermally conductive adhesive or solder paste or solder is conventionally deposited onto a thermal contact of each LED or onto a top side of each metal heat spreader. Subsequently each LED is placed on top a corresponding metal heat spreader, such that the thermally conductive adhesive or solder paste or solder is in direct contact with the thermal contact of each LED and with the corresponding metal heat spreader. Afterwards the thermally conductive adhesive may be cured, if necessary, or the solder may be re-flowed in order to structurally attach each LED. In embodiments with LED submounts, thermally conductive adhesive or solder paste or solder is conventionally deposited onto one or more bottom contacts of each LED or onto one or more top contacts of each LED submount. Subsequently each LED is placed on top a corresponding LED submount, such that the thermally conductive adhesive or solder paste or solder is in direct contact with the bottom contact(s) of each LED and with the top contact(s) of each corresponding LED submount. Afterwards the thermally conductive adhesive may be cured, if necessary, or the solder may be re-flowed in order to structurally attach each LED. Once an LED has been structurally attached to a corresponding submount, the LED may be electrically and optically tested, although testing is optional. Next thermally conductive adhesive or solder paste or solder is conventionally deposited onto a thermal contact of each LED submount or onto a top side of each metal heat spreader. Subsequently each LED submount is placed on top a corresponding metal heat spreader, such that the thermally conductive adhesive or solder paste or solder is in direct contact with the thermal contact of each LED submount and with the corresponding metal heat spreader. Afterwards the thermally conductive adhesive may be cured, if necessary, or the solder may be reflowed in order to structurally attach each LED submount.

In embodiments of the present LED array which comprise LEDs with bond pads or LED submounts with bondable top electrical contacts, a conventional wire bonding process may be used to electrically couple an LED with the bendable electrical interconnection layer, once the LED is structurally attached to a corresponding metal heat spreader. In embodiments with LEDs comprising bottom electrical contacts, electrically conductive adhesive or solder paste or solder is conventionally deposited onto one or more bottom electrical contacts of each LED or onto one or more top contacts of each LED submount. Subsequently each LED is placed on top a corresponding LED submount, such that the electrically conductive adhesive or solder paste or solder is in direct contact with the bottom electrical contact(s) of each LED and with the corresponding top contact(s) of each corresponding LED submount. Afterwards the electrically conductive adhesive may be cured, if necessary, or the solder may be reflowed in order to electrically couple each LED with a corresponding LED submount. In embodiments comprising LED submounts with bottom electrical contacts, electrically conductive adhesive or solder paste or solder is conventionally deposited onto bottom electrical contacts of each LED submount or onto corresponding metal pathways or traces of the electrical interconnection layer. Subsequently each LED submount is placed into the LED array such that the electrically conductive adhesive or solder paste or solder is in direct contact with the bottom electrical contacts of each LED submount and with the corresponding metal pathways or traces of the electrical interconnection layer. Afterwards the electrically conductive adhesive may be cured, if necessary, or the solder may be reflowed in order to electrically couple each LED submount with corresponding metal pathways or traces of the electrical interconnection layer. Without LED submounts, LEDs with bottom electrical contacts may be electrically coupled to corresponding metal pathways or traces of the electrical interconnection layer with electrically conductive adhesive or solder paste or solder, using a similar process flow. The electrically conductive adhesive or solder paste or solder used for electrically coupling the LEDs to the electrical interconnection layer may be deposited concurrently with the thermally conductive adhesive or solder paste or solder used for structurally attaching the LEDs to the metal heat spreaders. In some implementations, the electrically conductive adhesive or solder paste or solder used for electrically coupling the LEDs to the electrical interconnection layer may be the same material as the thermally conductive material used for structurally attaching the LEDs to the metal heat spreaders, and this material may be reflowed or cured in the same process step.

Once the LEDs are structurally and electrically coupled to the LED array, some or all of the LEDs may be encapsulated inside lenses. A variety of processes may be used to encapsulate these LEDs inside lenses, as described earlier.

Embodiments of the present LED array that comprise a lead frame must have some lead frame tie bars removed by punching, sawing, or other suitable metal removal process. This tie bar removal process may occur anytime after the lead frame has been structurally attached to the metal heat spreaders. Typically this tie bar removal process occurs after the LEDs are encapsulated inside lenses.

After the present LED array is assembled, typically the heat spreaders are structurally and thermally coupled to a base which functions as a heat sink. This may be accomplished with a variety of conventional processes, such as conventionally depositing solder or solder paste or a thermally conductive adhesive onto either the heat spreaders or onto the base, then positioning the heat spreaders adjacent to the base (e.g., as shown in FIG. 8), and then re-flowing the solder or curing the adhesive.

Figure 19:
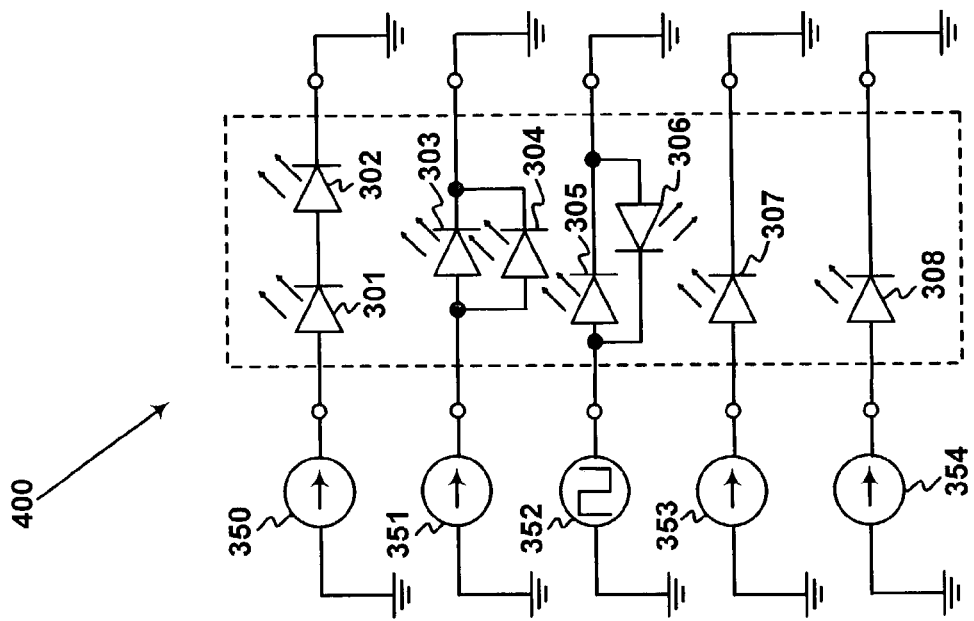
FIG. 19 is an electrical schematic diagram of an LED array with LEDs coupled to multiple external power supplies in a variety of functional electrical circuit configurations in accordance with the present invention.

In order to operate the present LED array, at least two separate metal pathways or traces of the electrical interconnection layer are electrically coupled to a voltage source or to a current source. This may be accomplished with a variety of conventional means, such as soldering wires onto the electrical interconnection layer and connecting these wires to an external power supply. If a voltage source is connected to the present LED array, typically at least one resistor may be connected in series with the LEDs to limit the LED current, although other circuit configurations are possible. If a current source is connected to the present LED array, typically no current-limiting resistors are necessary. As described earlier, the LEDs in the present array may be connected in series with the power supply, in parallel with the power supply, in anti-parallel with the power supply, or in some combination of these alternative circuit configurations. For example, FIG. 19 schematically shows an LED array 400 with LED 301 and LED 302 connected in series with a first current source 350, with LED 303 and LED 304 connected in parallel with a second current source 351, with LED 307 independently connected with a third current source 353, with LED 308 independently connected with a fourth current source 354, and with LED 305 and LED 306 connected in anti-parallel with an alternating current source 352. Each of these different circuit configurations in LED array 400 is a functional electrical circuit configuration which allows a power supply to electrically drive one or more corresponding LEDs in the array. In some alternate embodiments it may be desirable to independently connect each LED in the array to separate power supplies, for independent control of each LED. If high flux is desired, the power supply typically drives each LED at 70 mA–700 mA, depending on the LED size, the thermal efficiency of the heat sink base, the number of LEDs in the array, the maximum allowable LED junction temperature, and the ambient temperature.

Figure 3:
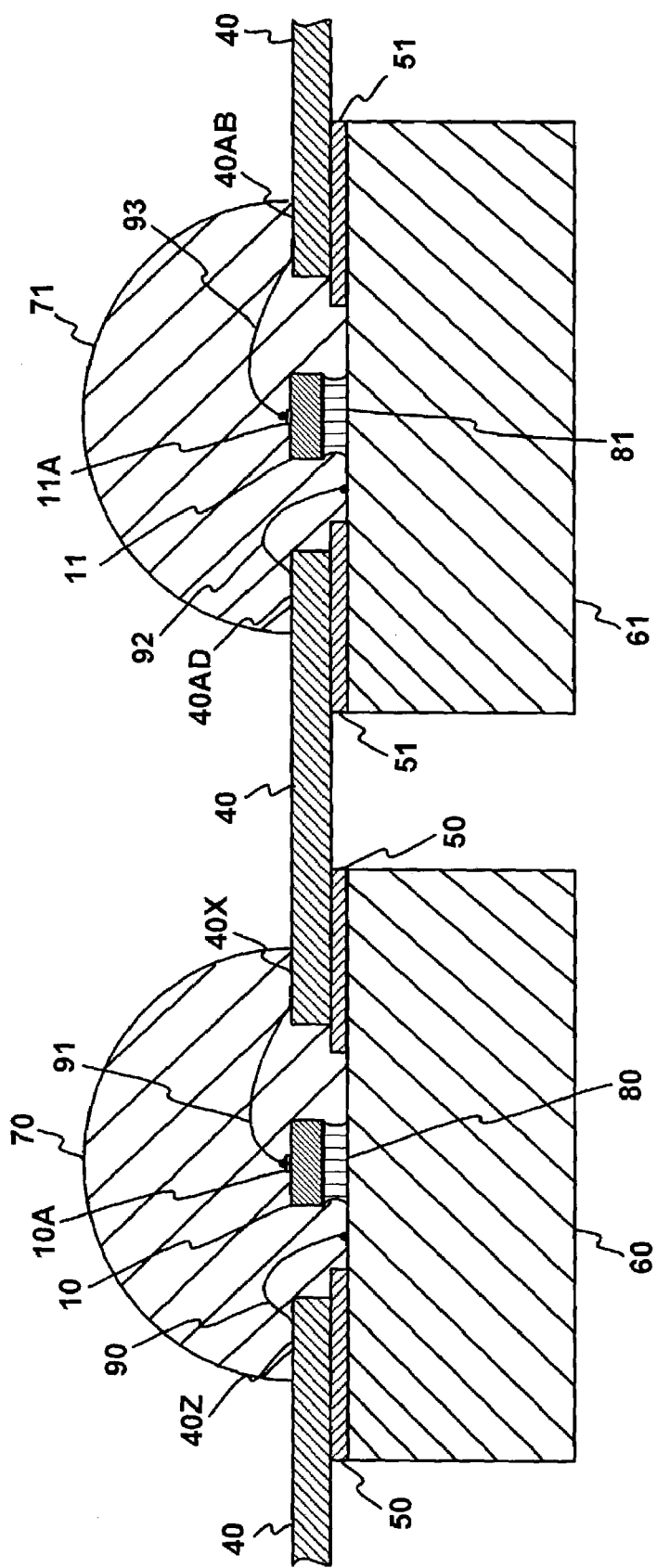
FIG. 3 schematically illustrates a portion of an LED array in accordance with a third embodiment of the present invention.

While the present invention is illustrated with particular embodiments, the invention is intended to include all variations and modifications falling within the scope of the appended claims. Although the term LED is used throughout this detailed description, this term refers to any semiconductor diode die that emits light, including infrared light, visible spectrum light, or ultraviolet light. As such, this term also refers to laser diode die and VCSEL diode die. For example, although FIG. 1, FIG. 6, FIG. 10, FIG. 11, and FIG. 14 show only one LED attached to a corresponding LED submount, some other embodiments may comprise LED submounts with more than one LED attached per submount. In such embodiments, some or all of the multiple LEDs on a submount may be electrically connected, for example, in series, in parallel, or in anti-parallel. A submount in such embodiments may comprise metal traces suitable for such an electrical configuration. Moreover, the present invention may include some LEDs disposed on submounts and some LEDs attached directly to the metal heat spreader. Although FIG. 5 shows a printed circuit board or flex circuit with only one layer of conductive metal traces, alternate embodiments of the present invention may comprise a printed circuit board or flex circuit with multiple layers of conductive traces. Although FIG. 2, FIG. 3, and FIG. 9 show only one LED attached to a corresponding metal heat spreader, some other embodiments may comprise metal heat spreaders with more than one LED attached per heat spreader.

The present invention has several key advantages over prior art LED arrays. Unlike some prior art bendable LED arrays, each LED die in the present LED array is either attached to a corresponding metal heat spreader with a layer of thermally conductive material underneath, such as solder, or each LED die is mounted onto a larger, thermally conductive submount which is attached to a corresponding metal heat spreader with a layer of thermally conductive material underneath. These metal heat spreaders may be thermally coupled to a common heat sink underneath. Either of these configurations allows heat to flow unimpeded in a pyramid-shaped heat flow pattern from each LED die through the corresponding metal heat spreader to a common heat sink, thus maximizing heat flow. Unlike some prior art bendable LED arrays, the dielectric material disposed between each metal heat spreader and the electrical interconnection layer (for electrical isolation of the heat spreaders) comprises vias/openings that allow thermally conductive material(s) to thermally couple each LED die with a corresponding metal heat spreader underneath. The thermally insulating dielectric material does not impede heat flow from each LED die to the heat spreader underneath because thermally conductive material passes through these vias/openings. Unlike some prior art high flux LED arrays, the present invention comprises LED dice thermally coupled to spatially separated heat spreaders and electrically coupled to a bendable electrical interconnection layer attached to these heat spreaders. This configuration of components enhances the bendability of the LED array.

Many embodiments of the present invention comprise a less expensive electrical interconnection layer than prior art LED arrays, which is another advantage of the present invention. Many prior art bendable LED arrays comprise a flex circuit or a flexible printed circuit board, which is typically more expensive than metal lead frames. Most embodiments of the present invention instead comprise a bendable metal frame, which comprises a metal lead frame and a set of metal heat spreaders attached to it, as shown in FIG. 1, FIG. 2, FIG. 3, FIG. 4, FIG. 6, FIG. 9, FIG. 10, FIG. 11, FIG. 14, FIG. 15, and FIG. 18. Such a bendable lead frame structure comprises electrical current pathways and heat spreader regions attached together, as shown in all these figures.

The above embodiments are only illustrative of the principles of this invention and are not intended to limit the invention to the particular embodiments described. Accordingly, various modifications, adaptations, and combinations of various features of the described embodiments can be practiced without departing from the scope of the invention as set forth in the appended claims.

I claim:

1. A bendable electromagnetic radiation emitting semiconductor dice array comprising:
   a plurality of metal heat spreaders;
   at least one dielectric layer disposed above a first portion of each of the underlying plurality of metal heat spreaders, creating a first portion of a plurality of openings, each opening disposed over a corresponding metal heat spreader;
   a bendable electrical interconnection layer disposed above a first portion of the at least one dielectric layer and creating a second portion of each said opening disposed over a corresponding metal heat spreader, wherein said bendable electrical interconnection layer comprises a plurality of electrical current pathways; and
   a plurality of electromagnetic radiation emitting semiconductor dice, wherein each of the dice is mounted over a corresponding one of the plurality of metal heat spreaders with a corresponding thermal conduction means that provides a direct thermal pathway from the die to the underlying metal heat spreader, and wherein each die is electrically coupled to the bendable electrical interconnection layer.

2. The bendable electromagnetic radiation emitting semiconductor dice array of claim 1 wherein said plurality of electromagnetic radiation emitting semiconductor dice comprises diodes selected from the group consisting of light emitting diodes (LEDs), infrared emitting diodes, ultraviolet emitting diodes, laser diodes, and VCSEL diodes, and wherein each of the dice comprises a first electrical contact and a second electrical contact, said first electrical contact and said second electrical contact electrically coupled to separate pathways of said plurality of electrical current pathways.

3. The bendable electromagnetic radiation emitting semiconductor dice array of claim 1 or claim 2 wherein each of said thermal conduction means comprises at least one element selected from the group consisting of thermally conductive adhesives, re-flowed solder materials, thermally conductive submounts, and thermally conductive dielectric layers.

4. The bendable electromagnetic radiation emitting semiconductor dice array of claim 1 or claim 2 wherein said bendable electrical interconnection layer comprises a component selected from the group consisting of bendable printed circuit boards, flexible printed circuit boards, flex circuits, and metal lead frames.

5. The bendable electromagnetic radiation emitting semiconductor dice array of claim 1 or claim 2 wherein said bendable electrical interconnection layer comprises a metal lead frame comprising said plurality of electrical current pathways, wherein at least one pathway of said plurality of electrical current pathways comprises at least one narrow portion for enhanced bendability therein, and wherein at least one pathway of said plurality of electrical current pathways comprises at least one wide portion for enhanced structural stiffness therein.

6. The bendable electromagnetic radiation emitting semiconductor dice array of claim 1 or claim 2 wherein said bendable electrical interconnection layer comprises a metal lead frame that comprises at least one stress relief feature.

7. The bendable electromagnetic radiation emitting semiconductor dice array of claim 6 wherein said at least one stress relief feature comprises a member selected from the group consisting of members with at least one C-shaped bend and members with at least one V-shaped bend and members with at least one S-shaped bend.

8. The bendable electromagnetic radiation emitting semiconductor dice array of claim 1 or claim 2 wherein said plurality of metal heat spreaders comprise metal with high thermal conductivity.

9. The bendable electromagnetic radiation emitting semiconductor dice array of claim 1 or claim 2 wherein at least one die of said plurality of electromagnetic radiation emitting semiconductor dice is thermally coupled to each heat spreader of said plurality of metal heat spreaders.

10. The bendable electromagnetic radiation emitting semiconductor dice array of claim 2 which further comprises a plurality of thermally conductive submounts, wherein at least one submount of said plurality of thermally conductive submounts is thermally coupled to each heat spreader of said plurality of metal heat spreaders.

11. The bendable electromagnetic radiation emitting semiconductor dice array of claim 10 wherein at least one die of said plurality of electromagnetic radiation emitting semiconductor dice is thermally coupled to each submount of said plurality of thermally conductive submounts.

12. The bendable electromagnetic radiation emitting semiconductor dice array of claim 1 or claim 2 wherein at least one heat spreader of said plurality of metal heat spreaders comprises an optically reflective surface disposed to reflect light emitted by at least one die of said plurality of electromagnetic radiation emitting semiconductor dice.

13. The bendable electromagnetic radiation emitting semiconductor dice array of claim 1 or claim 2 wherein said plurality of metal heat spreaders are thermally coupled to a heat sink.

14. The bendable electromagnetic radiation emitting semiconductor dice array of claim 1 or claim 2 wherein each heat spreader of said plurality of metal heat spreaders is structurally coupled to an adjacent heat spreader of said plurality of metal heat spreaders via at least one bendable interconnection member disposed therebetween.

15. The bendable electromagnetic radiation emitting semiconductor dice array of claim 1 or claim 2 further comprising at least one optically transmissive material disposed around at least one die of said plurality of electromagnetic radiation emitting semiconductor dice to form at least one housing for said at least one die.

16. The bendable electromagnetic radiation emitting semiconductor dice array of claim 1 or claim 2 wherein at least one heat spreader of said plurality of metal heat spreaders comprises an upper portion elevated above said bendable electrical interconnection layer and disposed through a corresponding opening of said plurality of openings, and wherein at least one of the dice of said plurality of electromagnetic radiation emitting semiconductor dice is disposed above and thermally coupled to the upper portion of the corresponding heat spreader.

17. The bendable electromagnetic radiation emitting semiconductor dice array of claim 1 or claim 2 which further comprises a plurality of dielectric bodies, wherein each of the dielectric bodies is disposed around an enclosed portion of a corresponding metal heat spreader and around a corresponding enclosed portion of said bendable electrical interconnection layer, and wherein said plurality of dielectric bodies comprise said at least one dielectric layer, and wherein a bottom portion of each of the corresponding metal heat spreaders is externally disposed outside said plurality of dielectric bodies for enhanced heat dissipation.

18. The bendable electromagnetic radiation emitting semiconductor dice array of claim 11, wherein each of the submounts of said plurality of thermally conductive submounts comprises at least one electrical contact, and wherein at least one of the electrical contacts of each die of said plurality of electromagnetic radiation emitting semiconductor dice is electrically coupled to at least one corresponding electrical contact of the corresponding thermally conductive submount, and wherein at least one electrical contact of each said thermally conductive submount is electrically coupled to at least one corresponding pathway of said plurality of electrical current pathways.

19. The bendable electromagnetic radiation emitting semiconductor dice array of claim 14 wherein said plurality of metal heat spreaders and said at least one bendable interconnection member together consist of a single integrated metal piece.

20. A bendable electromagnetic radiation emitting semiconductor dice array comprising:
a bendable metal frame comprising a plurality of metal heat spreaders and a plurality of bendable electrical current pathways;
at least one dielectric material disposed between each heat spreader of said plurality of metal heat spreaders and at least one pathway of said plurality of bendable electrical current pathways; and
a plurality of electromagnetic radiation emitting semiconductor dice, wherein each of the dice is mounted above a portion of the corresponding heat spreader's top surface with a corresponding thermal conduction means that provides a direct thermal path from the die to the corresponding heat spreader, and wherein each of the dice is electrically coupled to at least two pathways of said plurality of bendable electrical current pathways; and wherein a heat transfer surface of each heat spreader of said plurality of metal heat spreaders has a greater surface area than the bottom surface of each die of said plurality of electromagnetic radiation emitting semiconductor dice.

21. The bendable electromagnetic radiation emitting semiconductor dice array of claim 20 wherein at least one heat spreader of said plurality of metal heat spreaders is thicker than at least one pathway of said plurality of bendable electrical current pathways, and wherein each of the dice comprises a first electrical contact and a second electrical contact, said first electrical contact and said second electrical contact electrically coupled to separate pathways of said plurality of bendable electrical current pathways.

22. The bendable electromagnetic radiation emitting semiconductor dice array of claim 20 wherein at least one heat spreader of said plurality of metal heat spreaders comprises a heat spreading region that widens as the distance from the die mounted above that heat spreader increases, and wherein each of the dice comprises a first electrical contact and a second electrical contact, said first electrical contact and said second electrical contact electrically coupled to separate pathways of said plurality of bendable electrical current pathways.

23. The bendable electromagnetic radiation emitting semiconductor dice array of claim 20, wherein at least one heat spreader of said plurality of metal heat spreaders is structurally and electrically integrated with an electrical current pathway of said plurality of bendable electrical current pathways as a single metal piece, and wherein each of the dice comprises a first electrical contact and a second electrical contact, said first electrical contact and said second electrical contact electrically coupled to separate pathways of said plurality of bendable electrical current pathways.

24. The bendable electromagnetic radiation emitting semiconductor dice array of claim 20, wherein at least one heat spreader of said plurality of metal heat spreaders is structurally attached to a corresponding electrical current pathway of said plurality of bendable electrical current pathways via a material selected from the group consisting of electrically conductive adhesives and solders, and wherein each of the dice comprises a first electrical contact and a second electrical contact, said first electrical contact and said second electrical contact electrically coupled to separate pathways of said plurality of bendable electrical current pathways.

25. The bendable electromagnetic radiation emitting semiconductor dice array of claim 20 further comprising a heat sink thermally coupled to said plurality of metal heat spreaders, and wherein each of the dice comprises a first electrical contact and a second electrical contact, said first electrical contact and said second electrical contact electrically coupled to separate pathways of said plurality of bendable electrical current pathways.

26. The bendable electromagnetic radiation emitting semiconductor dice array of claim 1 or claim 2 or claim 20 wherein said plurality of electromagnetic radiation emitting semiconductor dice comprises at least one diode comprising a plurality of bottom electrical contacts disposed underneath in a flip chip configuration.

27. The bendable electromagnetic radiation emitting semiconductor dice array of claim 1 or claim 2 or claim 20 wherein said plurality of electromagnetic radiation emitting semiconductor dice comprises at least one diode comprising at least one bottom thermal contact electrically isolated from that corresponding diode.

28. The bendable electromagnetic radiation emitting semiconductor dice array of claim 20 which further comprises a plurality of thermally conductive submounts, wherein each of the submounts of said plurality of thermally conductive submounts is thermally coupled to a corresponding heat spreader of said plurality of metal heat spreaders, and wherein each of the dice of said plurality of electromagnetic radiation emitting semiconductor dice is thermally coupled to a corresponding thermally conductive submount, and wherein each of the dice comprises a first electrical contact and a second electrical contact, said first electrical contact and said second electrical contact electrically coupled to separate pathways of said plurality of bendable electrical current pathways, and wherein each of the submounts of said plurality of thermally conductive submounts comprises at least one electrical contact, and wherein at least one of the electrical contacts of each die of said plurality of electromagnetic radiation emitting semiconductor dice is electrically coupled to at least one corresponding electrical contact of the corresponding thermally conductive submount, and wherein at least one electrical contact of each said thermally conductive submount is electrically coupled to at least one corresponding pathway of said plurality of bendable electrical current pathways.

29. The bendable electromagnetic radiation emitting semiconductor dice array of claim 18 or claim 28 wherein at least one submount of said plurality of thermally conductive submounts is thermally coupled to at least two corresponding dice of said plurality of electromagnetic radiation emitting semiconductor dice, and wherein each of said at least one submount comprises at least one electrical circuit pathway electrically coupling said at least two corresponding dice.

30. The bendable electromagnetic radiation emitting semiconductor dice array of claim 29 wherein each said at least one electrical circuit pathway electrically couples said at least two corresponding dice in at least one configuration selected from the group consisting of configurations electrically connected in series, configurations electrically connected in parallel, and configurations electrically connected in anti-parallel.

31. The bendable electromagnetic radiation emitting semiconductor dice array of claim 18 or claim 28 wherein at least one submount of said plurality of thermally conductive submounts comprises a plurality of electrical contacts and at least one electrical circuit component electrically coupled with said plurality of electrical contacts.

32. The bendable electromagnetic radiation emitting semiconductor dice array of claim 1 or claim 2 or claim 20 wherein the corresponding thermal conduction means comprises a thermally and electrically conductive material electrically coupled in series with at least one die of said plurality of electromagnetic radiation emitting semiconductor dice.

33. The bendable electromagnetic radiation emitting semiconductor dice array of claim 20 which further comprises a plurality of dielectric bodies, wherein each of the dielectric bodies is disposed around an enclosed portion of a corresponding metal heat spreader and around an enclosed portion of at least one corresponding bendable electrical current pathway, and wherein said plurality of dielectric bodies comprise said at least one dielectric material, and wherein an exterior portion of each of the corresponding metal heat spreaders is externally disposed outside said plurality of dielectric bodies for enhanced heat dissipation, and wherein each of the dice comprises a first electrical contact and a second electrical contact, said first electrical contact and said second electrical contact electrically coupled to separate pathways of said plurality of bendable electrical current pathways.

34. The bendable electromagnetic radiation emitting semiconductor dice array of claim 20 which further comprises a plurality of housings, wherein each of the housings is disposed around at least one die of said plurality of electromagnetic radiation emitting semiconductor dice, and wherein said plurality of housings comprise at least one optically transmissive dielectric material, and wherein bendable portions of said plurality of bendable electrical current pathways are disposed between the housings, and wherein each of the dice comprises a first electrical contact and a second electrical contact, said first electrical contact and said second electrical contact electrically coupled to separate pathways of said plurality of bendable electrical current pathways.

35. A method of assembling a bendable electromagnetic radiation emitting semiconductor dice array comprising:
   providing a bendable electrical interconnection layer;
   attaching a plurality of heat spreaders to the bendable electrical interconnection layer via at least one adhesive dielectric layer, wherein a portion of a first surface of each heat spreader is exposed;
   attaching a plurality of electromagnetic radiation emitting semiconductor dice to said plurality of heat spreaders by mounting each die of said plurality of electromagnetic radiation emitting semiconductor dice to the exposed portion of the first surface of a corresponding heat spreader via a corresponding thermal conductor; and
   electrically coupling each die of said plurality of electromagnetic radiation emitting semiconductor dice into a functional electrical circuit configuration via said bendable electrical interconnection layer.

36. The method of providing a dice array of claim 35 wherein each said thermal conductor comprises at least one element selected from the group consisting of thermally conductive adhesives, re-flowed solder materials, thermally conductive submounts, and thermally conductive dielectric layers.

37. The method of providing a dice array of claim 35 wherein the step of electrically coupling each die comprises electrically connecting at least two electrical contacts of each die to said bendable electrical interconnection layer and removing at least one tie bar from said bendable electrical interconnection layer.

38. The method of providing a dice array of claim 35 wherein said bendable electrical interconnection layer comprises a component selected from the group consisting of bendable printed circuit boards, flexible printed circuit boards, flex circuits, and metal lead frames.

39. The method of providing a dice array of claim 35 further comprising the step of bending the bendable electrical interconnection layer into a 3 dimensional configuration.

40. The method of providing a dice array of claim 35 further comprising the step of thermally coupling said plurality of heat spreaders to a heat sink for enhanced heat dissipation.

41. The method of providing a dice array of claim 35 further comprising the step of providing at least one optically transmissive material around at least one of the dice to form at least one housing.

42. A method of providing a bendable electromagnetic radiation emitting semiconductor dice array comprising:
  providing a bendable lead frame structure, wherein said bendable lead frame structure comprises a plurality of predefined metal heat spreader regions and a plurality of predefined bendable metal electrical current pathways;
  attaching a plurality of electromagnetic radiation emitting semiconductor dice to said plurality of predefined metal heat spreader regions by mounting each of the dice to a corresponding one of the predefined metal heat spreader regions via a corresponding thermal conductor; and
  electrically coupling each die of said plurality of electromagnetic radiation emitting semiconductor dice into a functional electrical circuit configuration via at least two pathways of said plurality of predefined bendable metal electrical current pathways.

43. The method of providing a dice array of claim 42 wherein the step of electrically coupling each die comprises electrically connecting at least two electrical contacts of each die to at least two corresponding pathways of said plurality of predefined bendable metal electrical current pathways and removing at least one tie bar from said bendable lead frame structure.

44. The method of providing a dice array of claim 42 further comprising the step of bending said bendable lead frame structure into a 3 dimensional configuration.

45. The method of providing a dice array of claim 42 further comprising the step of thermally coupling said plurality of predefined metal heat spreader regions to a heat sink for enhanced heat dissipation.

46. The method of providing a dice array of claim 42 further comprising the step of providing at least one optically transmissive material around at least one of the dice to form at least one housing.

47. A bendable electromagnetic radiation emitting semiconductor dice array comprising:
  a bendable thermally conductive metal substrate;
  at least one dielectric layer disposed above a first portion of said bendable thermally conductive metal substrate, creating a first portion of a plurality of openings, each opening disposed over said bendable thermally conductive metal substrate;
  a bendable electrical interconnection layer disposed above a first portion of said at least one dielectric layer and creating a second portion of each said opening disposed over said bendable thermally conductive metal substrate, wherein said bendable electrical interconnection layer comprises a plurality of mechanical stress relief features, and wherein said bendable electrical interconnection layer comprises a plurality of electrical current pathways; and
  a plurality of electromagnetic radiation emitting semiconductor dice, wherein each of the dice is mounted above said bendable thermally conductive metal substrate with a corresponding thermal conduction means that provides a direct thermal pathway from the die to said bendable thermally conductive metal substrate, and wherein each one of the dice comprises a first electrical contact and a second electrical contact, said first electrical contact and said second electrical contact electrically coupled to separate pathways of said plurality of electrical current pathways.

48. The bendable electromagnetic radiation emitting semiconductor dice array of claim 47 wherein said bendable thermally conductive metal substrate comprises a plurality of heat spreaders and a plurality of bendable interconnection members disposed between the adjacent heat spreaders.

49. The bendable electromagnetic radiation emitting semiconductor dice array of claim 2 or claim 20 or claim 47, wherein at least two of said electrical current pathways electrically couple at least two dice of said plurality of electromagnetic radiation emitting semiconductor dice in at least one configuration selected from the group consisting of configurations electrically connected in series, configurations electrically connected in parallel, and configurations electrically connected in anti-parallel.

\* \* \* \* \*